(12) United States Patent
Yeh

(10) Patent No.: US 9,176,187 B2
(45) Date of Patent: Nov. 3, 2015

(54) DIGITAL MULTI-METER WITH LCR FUNCTION

(71) Applicant: CYRUSTEK CORPORATION, Hsinchu (TW)

(72) Inventor: Yen-Hung Yeh, New Taipei (TW)

(73) Assignee: CYRUSTEK CORPORATION, Hsinchu (TW)

( * ) Notice: Subject to any disclaimer, the term of this patent is extended or adjusted under 35 U.S.C. 154(b) by 0 days.

(21) Appl. No.: 14/164,130

(22) Filed: Jan. 24, 2014

(65) Prior Publication Data

US 2015/0028892 A1    Jan. 29, 2015

Related U.S. Application Data

(60) Provisional application No. 61/756,121, filed on Jan. 24, 2013.

(30) Foreign Application Priority Data

Apr. 12, 2013    (TW) .............................. 102113040 A

(51) Int. Cl.
| | |
|---|---|
| G01R 31/317 | (2006.01) |
| G01R 27/02 | (2006.01) |
| G01R 27/26 | (2006.01) |
| G01R 15/12 | (2006.01) |

(52) U.S. Cl.
CPC ............ *G01R 31/317* (2013.01); *G01R 15/125* (2013.01); *G01R 27/02* (2013.01); *G01R 27/2605* (2013.01); *G01R 27/2611* (2013.01)

(58) Field of Classification Search
CPC .. G01R 31/317; G01R 27/2611; G01R 27/02; G01R 15/125; G01R 27/2605
USPC ........................................................ 324/654
See application file for complete search history.

(56) References Cited

U.S. PATENT DOCUMENTS

| | | | |
|---|---|---|---|
| 2007/0069716 A1* | 3/2007 | Sleeman et al. | ............ 324/99 D |
| 2013/0239709 A1* | 9/2013 | Dolleris et al. | .............. 73/866.3 |

\* cited by examiner

*Primary Examiner* — Tung X Nguyen
*Assistant Examiner* — Zannatul Ferdous
(74) *Attorney, Agent, or Firm* — Chih Feng Yeh; Huntington IP Consulting Co., Ltd.

(57) ABSTRACT

A Data acquisition apparatus for measuring purpose can be used as a Digital Multi-Meter (DMM) as well as a LCR meter, and this apparatus can be implemented in semiconductor chip adopted in a handheld case, it includes a DMM and a LCR meter. The LCR meter includes a LCR measuring circuit implemented with integrated circuit. The LCR measuring circuit includes an impedance measuring circuit and an auto-zero amplifier which bias the input offset voltage and amplify the input signal that has passed a big resistor (PTC) to make the signal have a predetermined SNR suitable for the process by the LCR measuring circuit.

51 Claims, 18 Drawing Sheets

<Prior Art>

DIGITAL MULTI-METER WITH LCR FUNCTION

CROSS-REFERENCE TO RELATED APPLICATION

The present application claims the benefit of the TAIWAN Patent Application Serial Number 102116040 of Apr. 12, 2013, and claims the benefit of the U.S. Provisional Application No. 61/756,121, filed Jan. 24, 2013, which are herein incorporated by reference in its entirety.

TECHNICAL FIELD

The present disclosure in general relates to a data acquisition apparatus and method for acquiring electrical characteristics of the device under test (DUT), and more particularly, to a handheld data acquisition apparatus having a Digital Multimeter (DMM) with LCR measurement function (to measure Inductance, Capacitance, and Resistance) integrated into single enclosure, take one for example, an analog front end chip suitable for LCR bridge meter with DMM function.

DESCRIPTION OF RELATED ART

Conventional DMM is a kind of data acquisition apparatus, and it has several measurement modes to acquire different types of data, such as voltage, current, resistance, . . . etc. Nowadays, many DMMs, especially handheld models, are composed of measuring circuit which consists of integrated circuits, and probes electronically coupled to the measuring circuit. Because DMMs are designed to test the device having unknown voltage/current, by regulation, the DMM products are required to pass the test for safety specification before they are allowed to enter the market. In addition, in some circumstances such as abnormal operation or mis-operation by a careless user or new hand, the unknown voltage/current on the Device-Under-Test (DUT) may be far above the ratings of the DMM. Therefore, it is easy to understand that, due to the nature of integrated circuit, and to protect the DMM from overload or damage, it is important to limit the input voltage or current from the DUT. The conventional approach to protect the integrated circuits of a DMM from damage is, between the probes and the integrated circuits, to insert a protection device or protection circuit which typically may be a material having high resistance or device having Positive Temperature Coefficient (PTC).

The measurement range of DMMs is typically from 400 mV to 4000V, 40 μA to 4 A, 40Ω to 40 MΩ. The selection of range can be made by a rotation knob or range key. The selection of measurement mode (voltage, current, and resistance) can be made by a rotation knob, and the selection of range can be made either by auto range or manual range, where a switch can be used to select either one. There are several different measurement modes—such as DCV, ACV, DCA and ACA—to measure voltage and current using Direct Current or Alternative Current. Some other recently developed models of DMM have added measurement modes for Capacitance and Frequency, with measurement range from 4 nF to 40 mF and from 4 Hz to 40 MHz, respectively. When measuring frequency, some models can be used to measure duty cycle. In addition, even when ACV or ACA measurement mode is selected as a measurement mode, the DMM can be used to measure frequency simultaneously.

To ensure safe use of DMM, all DMMs have to meet the safety standard, like CE600V, CE1000V, or CAT600V, CAT1000V, which shows the voltage rating of the DMM. For example, CE600V standard means when applying a voltage of 600 volt (or lower) to the probes or clips of the DMM, it will not burned or breakdown. The approach is to add adequate resistor between the DMM and its probes or clips.

For another type of data acquisition apparatus used to measure passive components such as inductor (L), capacitor (C), and resistor (R), which is widely known as LCR meter or LCR bridge or electric meter with LCR function . . . etc, the impedance of the DUT can be determined by the inductance (L), capacitance (C), and resistance (R) measured therefrom. Theoretically, the impedance caused by inductance and capacitance is collectively referred to as reactance and forms the imaginary part of complex impedance whereas resistance forms the real part, and it is the complex ratio of the voltage to the current in an alternating current (AC) circuit. Wherein the inductive reactance is $2\pi f L$, f stands for frequency and L stands for inductance, capacitive reactance is $$\frac{1}{2\pi fC},$$

C stands for capacitance. The higher frequency of AC circuit results in the lower capacitive reactance and the higher inductive reactance. In other words, the measured reactance is a function of measurement frequency. In addition, the inductance (L) or capacitance (C) itself is a function of frequency, called frequency response. Thus, to indicate the value of an inductor or a capacitor, the test condition, here measurement frequency, should be provided.

Because the LCR meter is designed to measure passive components, traditionally it is directly coupled to the DUT without the resistor, used for the consideration of safety standard, in between.

When the DUT is a resistor or a capacitor, a conventional DMM is used to electrically coupled to the DUT to apply voltage or current to the DUT, then, the resulted voltage or current can be used to determine the resistance or capacitance of the DUT. Therefore the voltage or current waveform applied to the DUT is usually a DC or a triangle wave. It's rare to find a DMM capable of measuring inductance. Even if there is, the measurement frequency is limited to DC or low frequency. Thus, it is not possible to extract the frequency response of a reactive device, especially extending to higher frequency range, from a conventional DMM.

A general LCR meter utilizing the balance bridge architecture such as that in FIG. 1 applies an AC signal (voltage or current) to the DUT and acquires its impedance (in complex form). The AC signal is a single frequency signal, for example a pure sine wave, so that the electrical characteristic of the DUT at that frequency can be extracted. In other words, to get the frequency response of the DUT, an LCR meter should be capable of providing different measurement frequencies. For example, a general LCR meter provides signals at 100 Hz, 120 Hz, 1 KHz and 10 KHz. Some LCR meters provide signals at higher frequencies, like 100 KHz or 1 MHz.

Regarding to the input path of DMM, as shown in FIG. 2A, protection devices such as PTC (Positive Temperature Coefficient) for voltage measurement or FUSE for current measurement must be utilized to compliant to the security standards—such as CATI, CATII, CATIII, . . . etc—to protect the measurement apparatus and prevent the user injury.

The component V.C. in FIG. 2A represents voltage clamping circuit, which is usually composed of transistors (as shown in FIG. 2B) or diodes (as shown in FIG. 2C). How and when does the protection device work? When input voltage exceeds the input rating, the transistors turn on and breakdown, sinking most of the current from the input, thus limiting the current into the Integrated Circuit under a certain level, and protect the DMM Measuring Integrated Circuit from damage. However, the input voltage entering the IC may still be too high, thus adding a PTC in the input path creates a voltage drop in between and helps reducing the voltage entering the IC.

On the other hand, as for the current protection device, please refer to FIG. 2A, terminal $T_{\mu A/mA}$ represents the current input terminal for current range in the order of μA or mA, terminal $T_{10A}$ represents the current input terminal for current range in the order of 10 A, and the resistance from terminal $T_{\mu A/mA}$ and terminal $T_{10A}$ is current shunt resistor $R_{CSR}$, which is to convert the input current to a voltage signal, and feed the voltage signal to DMM Measuring Integrated Circuit through Pin $P_{I-IN}$. Whenever DMM is used to measure a signal, the signal will traverse a corresponding input path, which is selected by a slide switch (switch knob or a button). In the same time, the non-selected input path will be kept circuit open by opening corresponding slide switches. The slide switches may include $SW_{\mu A}$, $SW_{mA}$, $SW_{Hz}$, $SW_{R/C/DIODE/CONT.}$, and $SW_{V/R/C/DIODE/CONT.}$. Therefore, in other aspects, this configuration also performs security protection for the DMM Measuring Integrated Circuit.

As for the operation of a DMM, please refer to FIG. 3A, when the DMM is used to measure voltage, one terminal of the voltage V is coupled to the terminal $T_{V/R+/C+}$, and the other terminal of the voltage V is coupled to the terminal $T_{COM}$. In addition, corresponding slide switch $SW_{V/R/C/DIODE/CONT.}$ is closed (short circuited), and corresponding pins $P_{V-IN}$ and $P_{SGND}$ are coupled to the two terminals of voltage V respectively, therefore the DMM can measure the voltage of V. Please refer to FIG. 3B, when the DMM is used to measure a DUT, which is a resistor, diode, capacitor, or electrical continuity, the slide switch $SW_{V/R/C/DIODE/CONT.}$ and $SW_{R/C/DIODE/CONT.}$ are closed (short circuited), and corresponding pins $P_{V-IN}$ and $P_{source-A}$ are coupled to one terminal of the DUT through terminal $T_{V/R+/C+}$, and $P_{SGND}$ are coupled to the other terminal of DUT through terminal $T_{COM(V-/A-/C-/R-)}$, therefore the DMM can measure the DUT when it is a resistor, diode, capacitor, or electrical continuity. please refer to FIG. 3C, when the DMM is used to measure frequency, one terminal of the source S is coupled to the terminal $T_{V/R+/C+}$, and the other terminal of the voltage V is coupled to the terminal $T_{COM(V-/A-/C-/R-)}$. In addition, corresponding slide switch $SW_{HZ}$ is closed (short circuited), and corresponding pins $P_{FREQ}$ and $P_{SGND}$ are coupled to the two terminals of source S respectively, therefore the DMM can measure the frequency of source S.

LCR meters are used to measure passive components such as a Capacitor, an Inductor, or a Resistor, not designed to measure current or voltage directly. Therefore, a voltage clamping circuit (V.C.) coupled to terminal $T_{LCR+}$ is enough to limit the input voltage to a certain value, and there's no need to add protection devices, like PTC, in the input path for the excessive high voltage considering passing certain safety standards.

As illustrated in FIG. 5, it shows the circuit diagram of the input path of a LCR meter when it is acquiring data from a DUT, i.e., measuring parameters from the DUT. When measuring parameters from the DUT, an AC current was sent from Pin $P_{FORCE+}$ through the DUT to the Pin $P_{FORCE-}$. Then the Pin $P_{SENSE+}$ and Pin $P_{SENSE-}$ capture the voltage drop on the DUT, and then the voltage drop was processed by an ADC (Analog to Digital Converter) and a processor to determine the impedance of the DUT. The aforementioned ADC and processor were not separately demonstrated because they were a portion of the impedance measuring circuit 800 as shown in FIG. 6, and they are one portion of a conventional LCR Measuring Circuit, in addition, they are widely used in a conventional LCR meter.

From all previous descriptions, DMM and LCR meters are used separately for the measurement. However, it is not convenient because the user has to carry two meters, one DMM and one LCR, if there's a need for both measurements in one place. Therefore if someone can combine these two meters into one meter, it will resolve the long left but unsolved needs. Unfortunately, it is neither like putting these two meters together in one enclosure, nor dose them share one circuit board or one substrate of a integrated circuit. The first reason is that the complexity of the circuitry of LCR meter makes it difficult to implement a LCR meter in an Integrated Circuit, not to mention accommodating DMM with LCR measuring function. Second, the protection circuit in the DMM is necessitated not only by regulation, but also by the warranty for safe use. If the protection circuit, like large resistance such as PTC, of the DMM is inserted into the input path of the LCR meter, the SNR (Signal-to-Noise Ratio) of the resulted acquired data (measured parameters) from the DUT will be attenuated, and the available measurement range will be seriously shrunk, furthermore, severely lower the accuracy of the resulted measurement.

SUMMARY

In view of the afore-mentioned long left need, a Data acquisition apparatus has been disclosed herein. The present disclosure has accommodated a LCR meter with a digital multi-meter in a handheld case, thus the user can more conveniently use it to measure parameters of a device under test.

The handheld data acquisition apparatus according to the present disclosure is used to measure parameters from a device under test, and it includes the following: a digital multi-meter and a LCR meter with improved circuitry to overcome the issue resulted from the large resistance in the input paths of DMM meter.

The data acquisition apparatus according to the present disclosure is enclosed in a handheld housing for measuring parameters from a device under test. The output of the data acquisition apparatus was fed to a next stage process circuit and then fed to a display device of the handheld housing to show the parameters. The data acquisition apparatus at least includes a Digital Multi-Meter (DMM) and a LCR measuring circuit. The DMM is electrically coupled to a first terminal and a second terminal, which can be a ground terminal. The handheld housing respectively provides a hole for each of the first terminal and the second terminal, thus enabling objects outside exterior surface of the handheld housing electrically coupled to the first terminal and the second terminal. The first terminal is coupled to a dc resistor input path having a dc resistor input switch and a first protection device, the output of the digital multi-meter (DMM) is the first kind of output signal of the data acquisition apparatus. The housing of the data acquisition apparatus according to the present disclosure can be desktop or handheld style. According to the present disclosure, the output of the LCR measuring circuit is fed to the next stage process circuit. In conclusion, it is used to process the output of the DMM measuring circuit and the LCR measuring circuit, therefore, the user's operation to the data acquisition apparatus selectively enables a plurality of switches, thereby decided whether the first kind of output signal or the second kind of output signal being processed by the next stage process circuit. Subsequently, the output of the next stage process circuit is fed to the display device, and the display device shows the acquired data, or parameters, to the user.

The LCR measuring circuit in the present disclosure at least includes an impedance measuring circuit and an auto-zero amplifier selectively coupled respectively to the first terminal with one LCR input path and to the ground terminal through the other LCR input path. The LCR measuring circuit is selectively coupled respectively to the first terminal with one voltage feeding path and to the ground terminal with the other voltage feeding path.

Each of the two LCR input paths and the two voltage feeding paths having a LCR switch, the status change of all LCR switches are synchronized. One of the two voltage feeding paths has a first protection device between the first terminal, and one end of the LCR switch on corresponding LCR input path. When all LCR switches are closed, a voltage drop on the device under test is amplified by the auto-zero amplifier, then—fed to the impedance measuring circuit to determine the impedance of the device under test.

In most applications or utilizations, the data acquisition apparatus according to the present disclosure can further includes a first current input terminal and a second current input terminal respectively having one portion protruding outside exterior surface of the handheld housing. Particularly, in some modifications, the data acquisition apparatus further includes a digital multi-meter (DMM) measuring circuit selectively coupled respectively to a first current terminal through a current input path having a first current switch and a second current switch, and to the ground terminal through a grounding path having a DMM switch.

The DMM measuring circuit is coupled to the first terminal through a voltage input path having a voltage input switch, and is coupled to the first terminal through a dc resistor input path. One end of the voltage input switch being coupled to one end of a first voltage clamping circuit and to the DMM measuring circuit, the other end of the voltage input switch is coupled to the first terminal through a second protection device. The data acquisition apparatus is used to measure voltage drop between the first terminal and the ground terminal when the DMM switch and the voltage input switch are both closed. In one aspect of the preferred embodiment of the present invention, the second protection device can be implemented with resistor having positive temperature coefficient.

In the data acquisition apparatus of the present disclosure, the dc resistor input path couples the DMM measuring circuit through a dc resistor input switch, one end of the dc resistor input switch coupled to the first terminal through a third protection device. The other end of the dc resistor input switch being coupled to one end of a second voltage clamping circuit and to the DMM measuring circuit, the DMM switch being coupled to the ground terminal. In one aspect of the preferred embodiment of the present invention, the third protection device can be implemented with resistor having positive temperature coefficient.

The data acquisition apparatus is used to measure direct current (DC) resistance between the first terminal and the ground terminal when all of the following switches are closed: a corresponding DMM function-selection switch coupled to the third protection device, the other corresponding DMM function-selection switch coupled to the second protection device, and the DMM switch. The voltage drop between the first terminal and the ground terminal is used to determine impedance when the status of the DMM switch is open.

In one embodiment of the present invention, the DMM switch has one end both coupled to the ground terminal and to one end of a current shunt resistor, the other end of the current shunt resistor is coupled to the second current terminal through a first fuse, and the other end of the current shunt resistor is also coupled to the first current terminal through the other current shunt resistor connected with a switch set and a second fuse. The switch set at least including the first current switch, the second switch, and a third current shunt resistor connecting one end of the first current switch and one end of the second current switch.

The voltage drop on the current shunt resistor plus the other current shunt resistor and the third current shunt resistor is used to determine the current through the ground terminal when the DMM switch is closed and at least one of the first current switch as well as the second current switch is opened. One end of the first current switch is coupled to a third voltage clamping circuit, one end of the second current switch is coupled to the other end of the other current shunt resistor, the other end of the first current switch as well as the other end of the second current switch are coupled to the first current terminal through the second fuse.

The digital multi-meter can further includes at least one digital multi-meter (DMM) measuring circuit selectively coupled to the first current terminal through a frequency input path having a frequency input switch. One end of the frequency input switch is coupled to the first terminal through a third protection device, the other end of the frequency input switch is coupled to the DMM measuring circuit and a fourth voltage clamping circuit through a coupling capacitor. The Data acquisition apparatus is used to measure frequency of a signal through the first terminal and the ground terminal when the frequency switch and the ground switch are both closed. According to one embodiment of the present invention, the first protection device is a resistor with Positive Temperature Coefficient, and the LCR measuring circuit is implemented in integrated circuit. In some modification to the present invention, the DMM meter in the present invention is manufactured with Integrated Circuits, i.e., in a front end chip, and on the same substrate as that of the LCR measuring circuit in the present invention.

These and other features, aspects, and advantages of the present disclosure will become better understood with reference to the following description and appended claims.

BRIEF DESCRIPTION OF THE DRAWINGS

These and other features, aspects and advantages of the present invention will become better understood with reference to the following description, appended claims and the accompanying drawings, where:

DETAILED DESCRIPTION

The present invention will now be described more specifically with reference to the following embodiments, which are provided for the purpose of demonstration rather than limitation.

To accommodate DMM and LCR meters in one enclosure, in one aspect of the embodiment of the present disclosure, which is a handheld enclosure, the present invention has modified the input path and a portion of the integrated circuit, and makes the resulted data acquisition apparatus according to the present invention be used as a DMM and a LCR meter as well. In conclusion, the data acquisition apparatus according to the present invention performs as a DMM with LCR measuring function.

In order to accommodate LCR meter into DMM, although the circuitry of the LCR meter is very complex, the LCR meter according to the present invention was implemented in an Integrated Circuit, and has accommodated the DMM on a same substrate of the integrated circuit. In addition, the data acquisition apparatus according to the present invention has protection devices (such as PTC resistor) in its input path to protect the DMM within. Furthermore, to accurately perform impedance measurement (LCR measuring function), the data acquisition apparatus according to the present invention has overcome the issues resulted from the protection circuit in the input path of the data acquisition apparatus.

Figure 7:
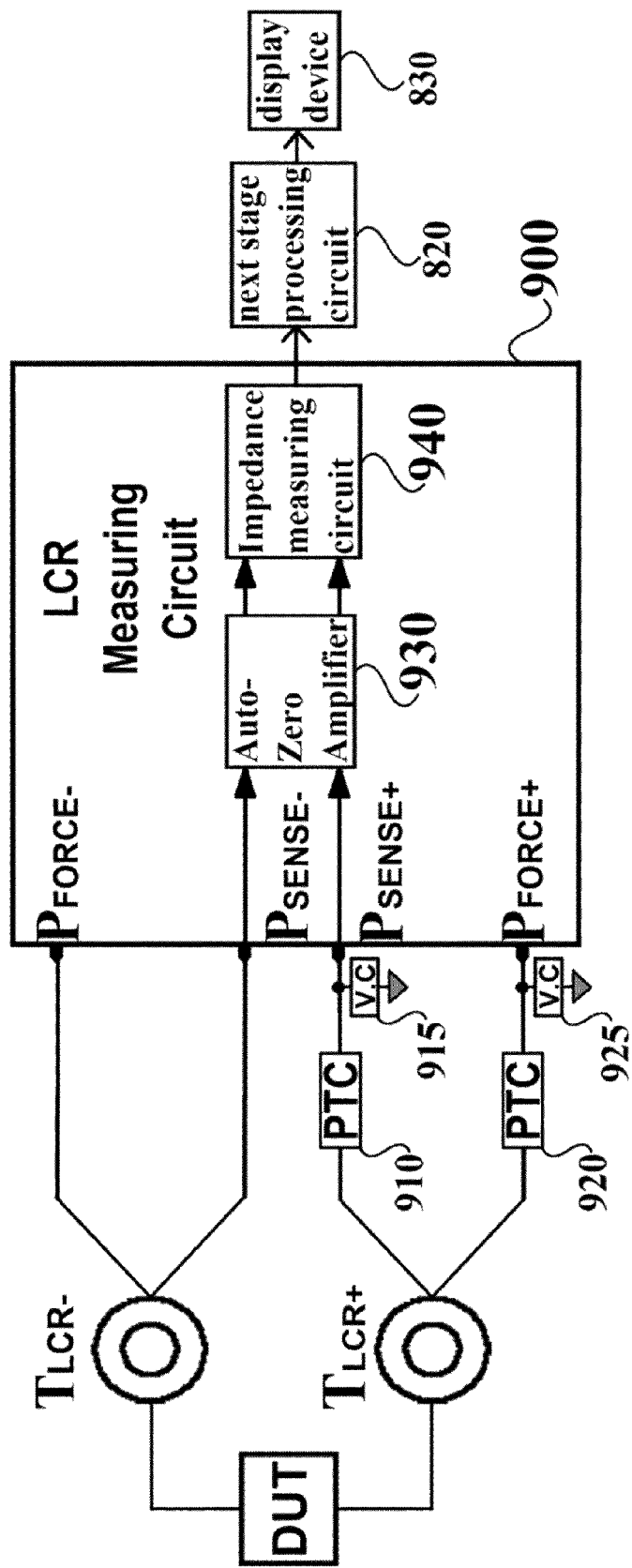
FIG. 7 illustrates the configuration of an improved LCR meter according to one preferred embodiment of the present invention, it shows a major component used to adjust the captured voltage to a predetermined level suitable for being processed by the conventional component (impedance measuring circuit) in the next stage of the improved LCR measuring circuit in the present invention.

Please refer to FIG. 7, the LCR measuring circuit 900 is one portion of the part of the data acquisition apparatus according to the present invention, one terminal of DUT 10 was electrically coupled to the input terminal $T_{LCR-}$, and the other terminal was electrically coupled to the input terminal $T_{LCR+}$. One end of the protection circuit 910, such as PTC, was coupled through the first LCR input path to the terminal $T_{LCR+}$, and the other end of the protection circuit 910 was coupled through the first LCR input path to one terminal of the voltage clamping circuit (V.C.) 915 and to the Pin $P_{SENSE+}$ of the LCR measuring circuit 900. Similarly, one end of the protection circuit 920, such as PTC resistor, was coupled through a voltage feeding path to the terminal $T_{LCR+}$, and the other end of the protection circuit 920 was coupled through a voltage feeding path to one end of the voltage clamping circuit (V.C.) 925 and to the Pin $P_{FORCE+}$ of the LCR measuring circuit 900.

On the other hand, the terminal $T_{LCR-}$ was coupled to the Pin $P_{FORCE-}$ of the LCR measuring circuit 900. In addition, the terminal $T_{LCR-}$ was coupled to the Pin $P_{SENSE-}$ through the second input path to the LCR measuring circuit 900. According to one embodiment of the present invention, when measuring parameters from a DUT, an AC current was sent from Pin $P_{FORCE+}$ through the DUT to the terminal $T_{FORCE+}$. Then the Pin $P_{SENSE+}$ and Pin $P_{SENSE-}$ capture the voltage drop on the DUT, and feed the voltage drop to an auto-zero amplifier 930 to eliminate the input voltage offset and to amplify the captured voltage drop to a predetermined level suitable for the signal processing for the next stage (impedance measuring circuit 940) to analyze the value of the impedance of the DUT 10. Being processed by the auto-zero amplifier 930, the amplified voltage drop has its SNR (Signal to Noise Ratio) raised to a level that enables the impedance measuring circuit 940 to analyze and determine the impedance to a predetermined accuracy, which depends on the design of the auto-zero amplifier 930 according to the present invention.

In this present invention, although there is protection circuit in the input path, thus remarkably reduced the SNR of the voltage drop from the DUT 10, the auto-zero amplifier in one embodiment of the present invention has raised the SNR and provided appropriate input-offset-voltage compensation, therefore the accuracy of the measured parameter, i.e., acquired data, can be competive to the conventional LCR meter which cannot be used as a conventional DMM to measure other parameters from the DUT.

From the previous description, according to the present invention, the improved LCR measuring circuit can be combined with a DMM, therefore the resulted data acquisition apparatus according to the present invention can be used not only as a LCR meter to measure parameters of passive components, but also as a DMM to measure parameters such as voltage, current, and resistance . . . etc of a DUT. Please refer to FIG. 8, it illustrates one embodiment of the present invention, the data acquisition apparatus 1000 includes a LCR measuring circuit 900 and a DMM (digital multi-meter) measuring circuit 1010. In most occasions, the data acquisition apparatus according to the present invention will be viewed as a DMM with LCR measuring function. However, the present invention does not exclude any other applications.

Figure 6:
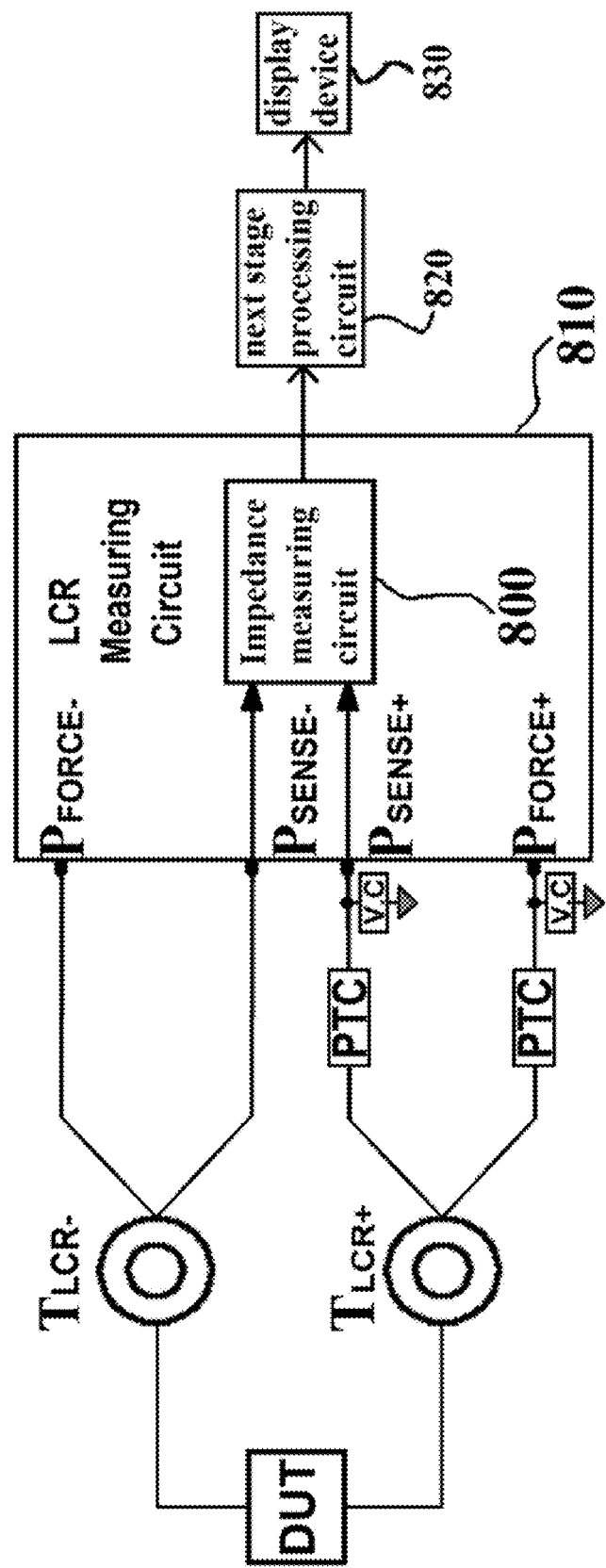
FIG. 6 illustrates the configuration of a conventional LCR meter showing its major component processing captured voltage from input paths when the conventional LCR meter is used to measure the parameters of a DUT.
Figure 8:
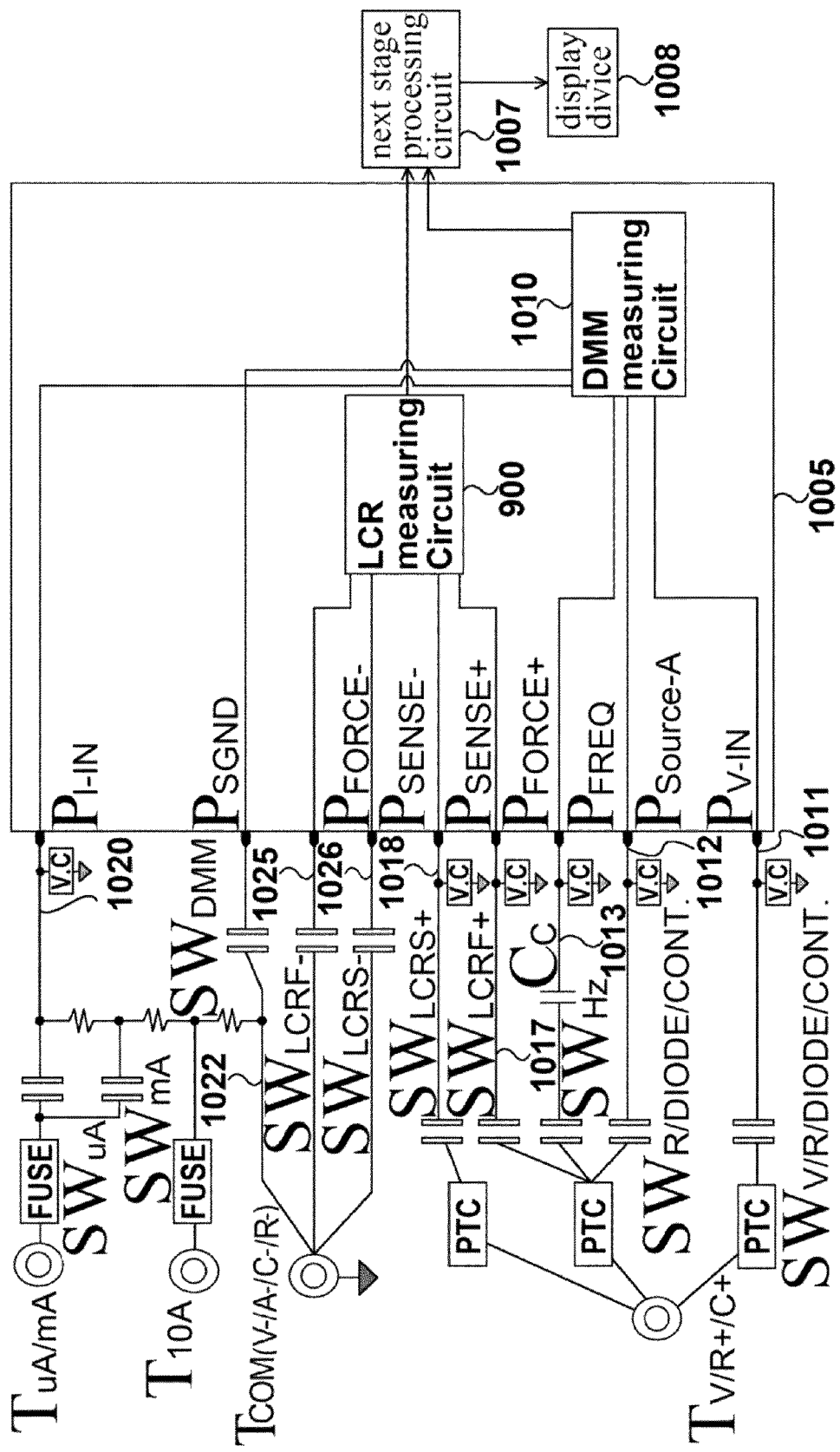
FIG. 8 illustrates the configuration of a data acquisition apparatus according to one preferred embodiment of the present invention, it shows all corresponding input paths and voltage feeding paths electrically coupling the data acquisition apparatus and corresponding input terminals, wherein the configuration of the input paths as well as voltage feeding paths and corresponding input terminals is in accordance with one aspect of the present invention.

As shown in FIG. 8, it is easy to figure out that, except for the circuit of the LCR measuring Circuit improved in the present invention, the pins of the data acquisition apparatus 1000 are identical to those of DMM measuring circuit 400 (shown in FIG. 2A) plus those of LCR measuring circuit 800 (shown in FIG. 6). For all the input paths in FIG. 8, it is also true that they are the combination of those of FIG. 2A plus those of FIG. 6, except for the following improvements. Such as, the first, the first Terminal $T_{V/R+/C+}$ in FIG. 2A can be coupled to $P_{V-IN}$, $P_{SOURCE-A}$, and $P_{FREQ}$ through one of three input paths, thus enabling three measurement modes by closing corresponding slide switch. In addition, the first terminal $T_{LCR+}$ in FIG. 6 is coupled to Pin $P_{FORCE+}$ and Pin $P_+$ respectively through a first voltage feeding path and a first LCR input path to LCR measuring circuit 900. In comparison, the first Terminal $T_{V/R+/C+}$ in FIG. 8 can be coupled to $P_{V-IN}$, $P_{SOURCE-A}$, and $P_{FREQ}$ respectively through one of the following input paths: voltage input path, dc resistor input path, and frequency input path. Thus enabling three DMM measurement modes by closing corresponding slide switch (frequency input switch $SW_{HZ}$, dc resistor input switch $SW_{R/C/DIODE/CONT.}$, and voltage input switch $SW_{V/R/C/DIODE/CONT.}$). In addition, when measurement mode LCR is selected, the slide switch $SW_{LCRS+}$ and $SW_{LCRF+}$ are closed, and the Terminal $T_{V/R+/C+}$ (in FIG. 8) serve as the terminal $T_{LCR+}$ (in FIG. 6). Furthermore, the pins $P_{FORCE+}$ and $P_{SENSE+}$ in FIG. 8 substantially have the same function with those in FIG. 6.

Figures 2A, 2B, 2C:
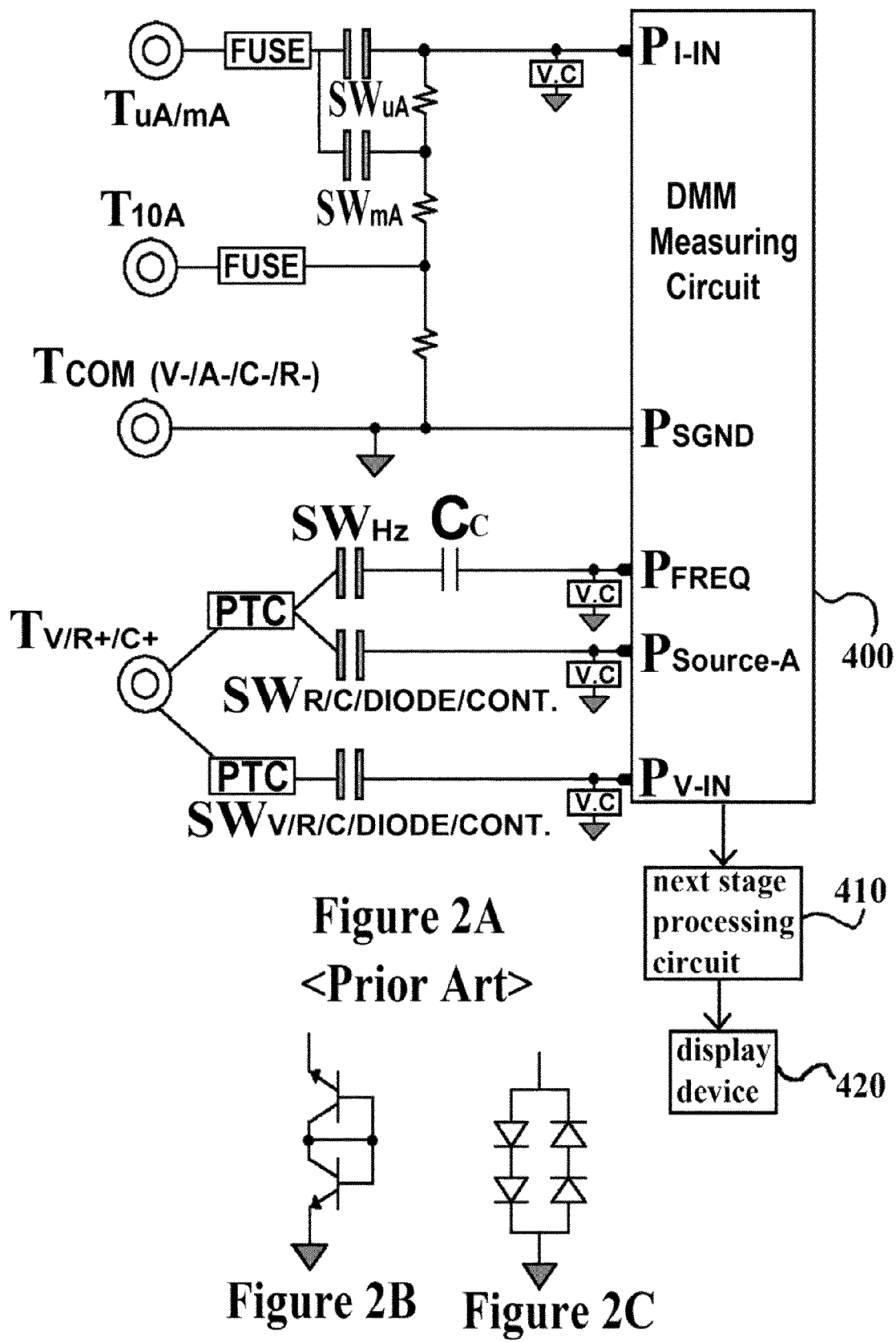
FIG. 2A illustrates the configuration of a conventional DMM which shows the pins of DMM measuring circuit connected to all input paths with corresponding slide switches and input terminals.
FIG. 2B illustrates the circuit diagram of a voltage clamping circuit using bipolar transistor.
FIG. 2C illustrates the circuit diagram of a voltage clamping circuit using diode.
Figure 3A:
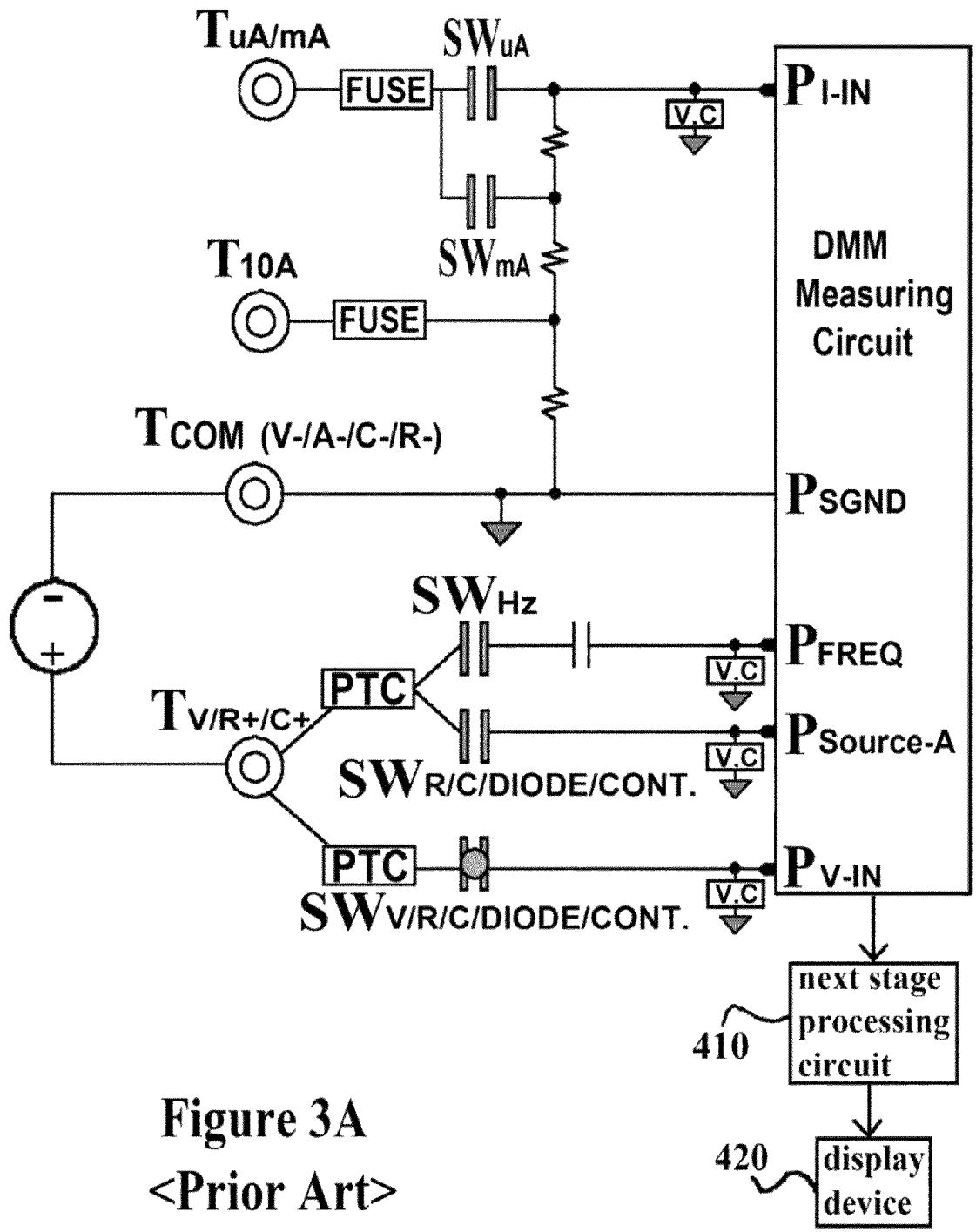
FIG. 3A illustrates the configuration of a conventional DMM showing how the input path and its corresponding slide switch work when the conventional DMM is used to measure voltage between two corresponding input terminals.
Figure 3B:
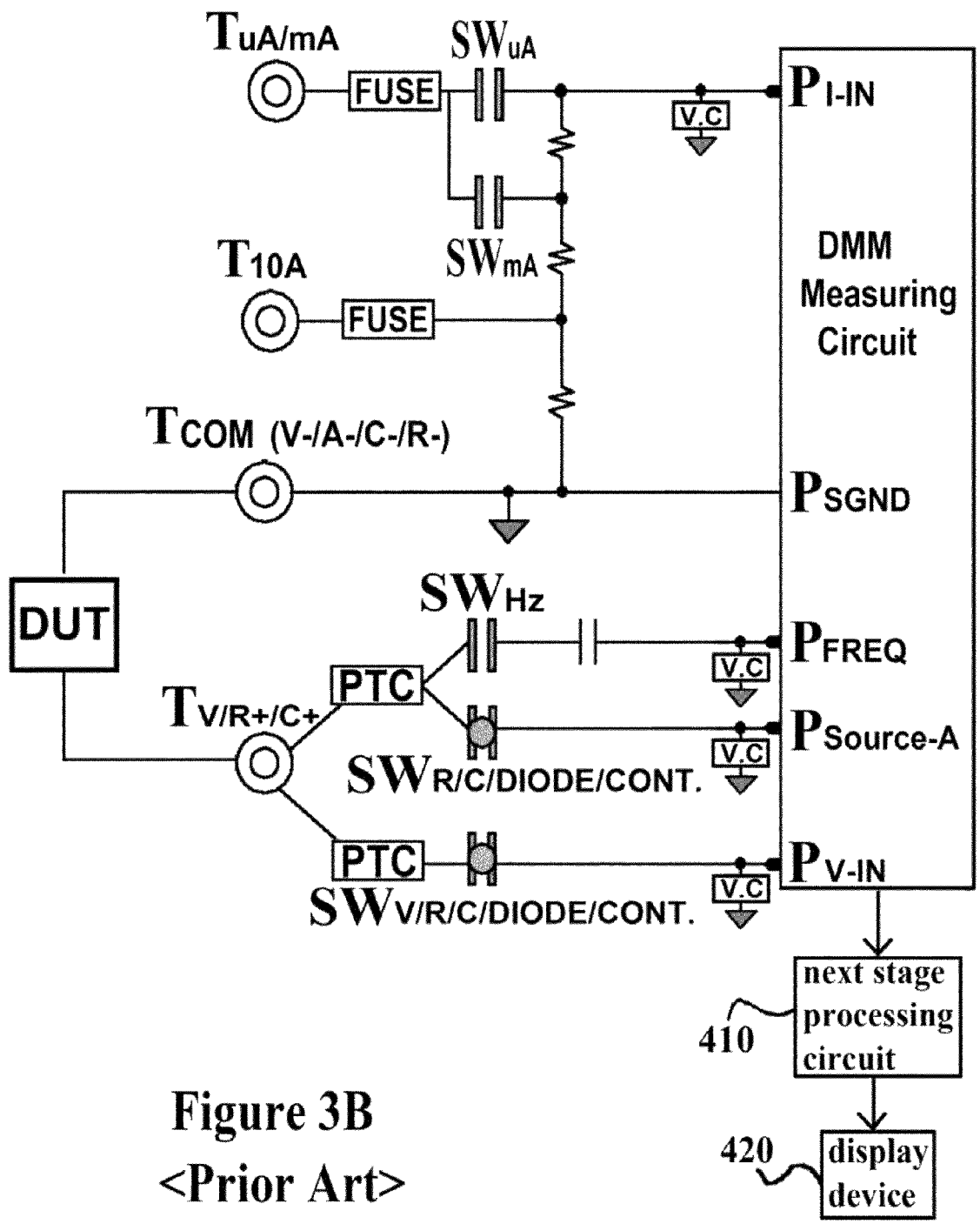
FIG. 3B illustrates the configuration of a conventional DMM showing how the input path and its corresponding slide switch works when the conventional DMM is used to measure resistance, diode, capacitor, or continuity between two input terminals of the DMM.
Figure 3C:
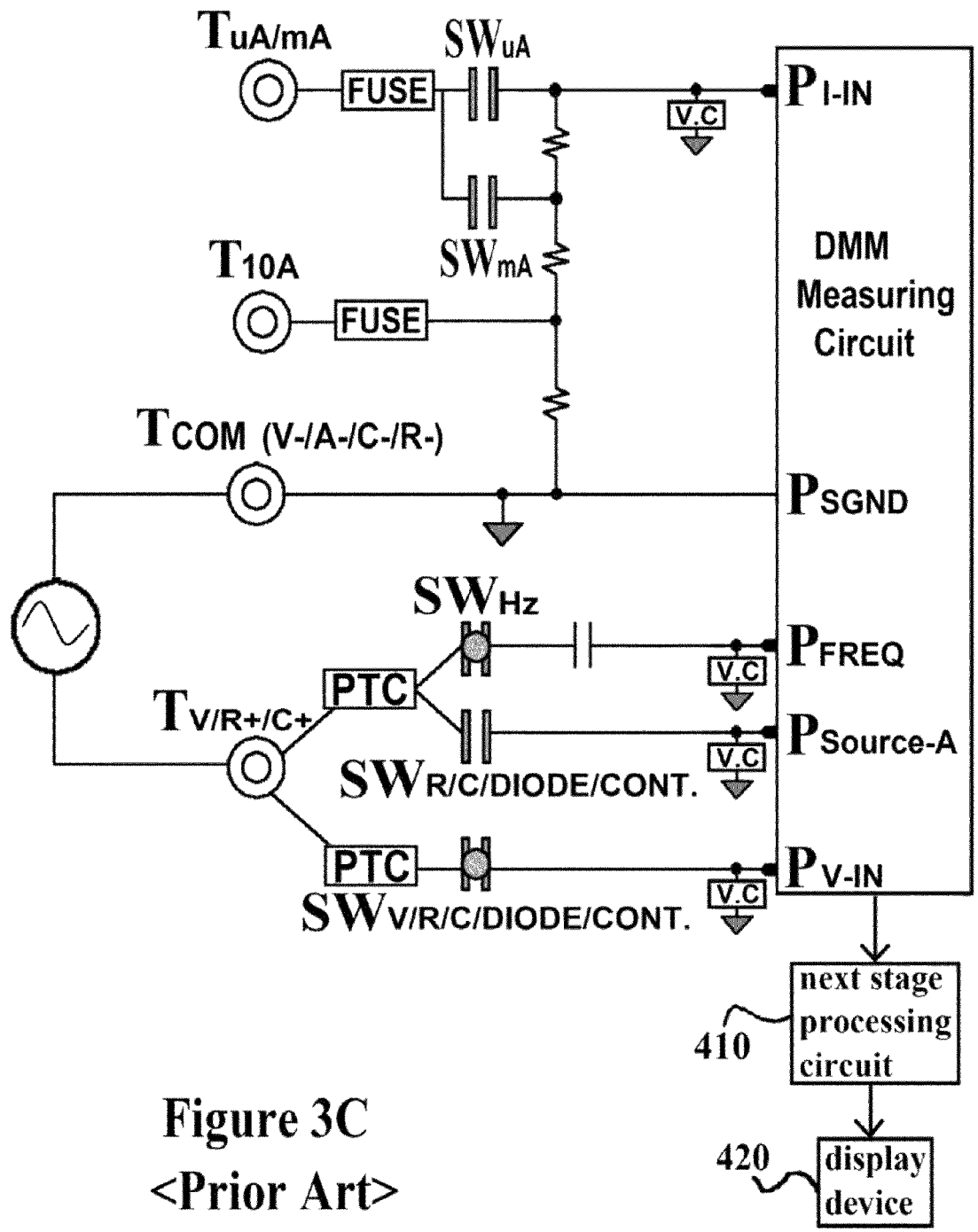
FIG. 3C illustrates the configuration of a conventional DMM showing how the input path and its corresponding slide switch works when the conventional DMM is used to measure the frequency of a signal through input terminals of the DMM.
Figure 4:
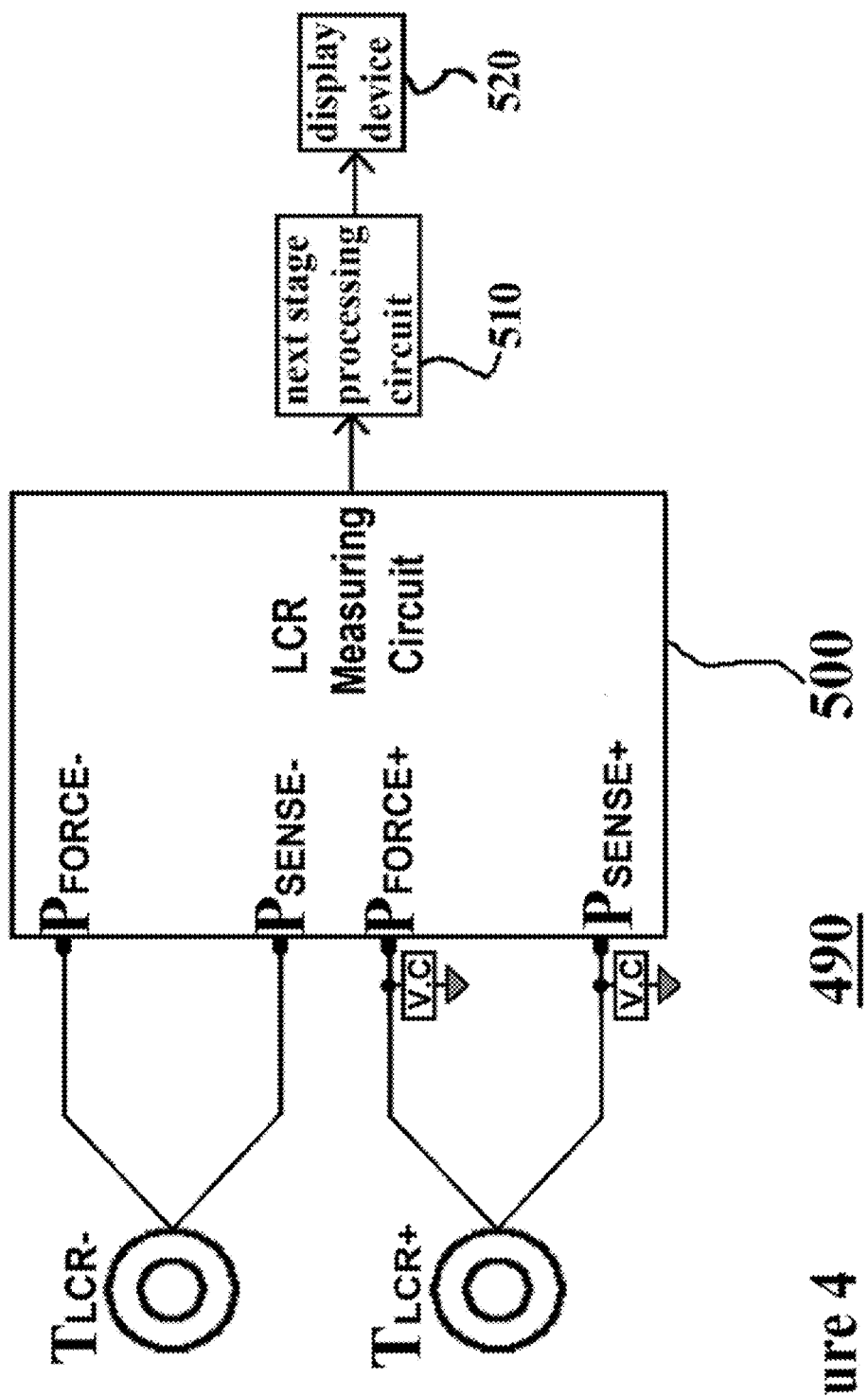
FIG. 4 illustrates the configuration of a conventional LCR meter.
Figure 5:
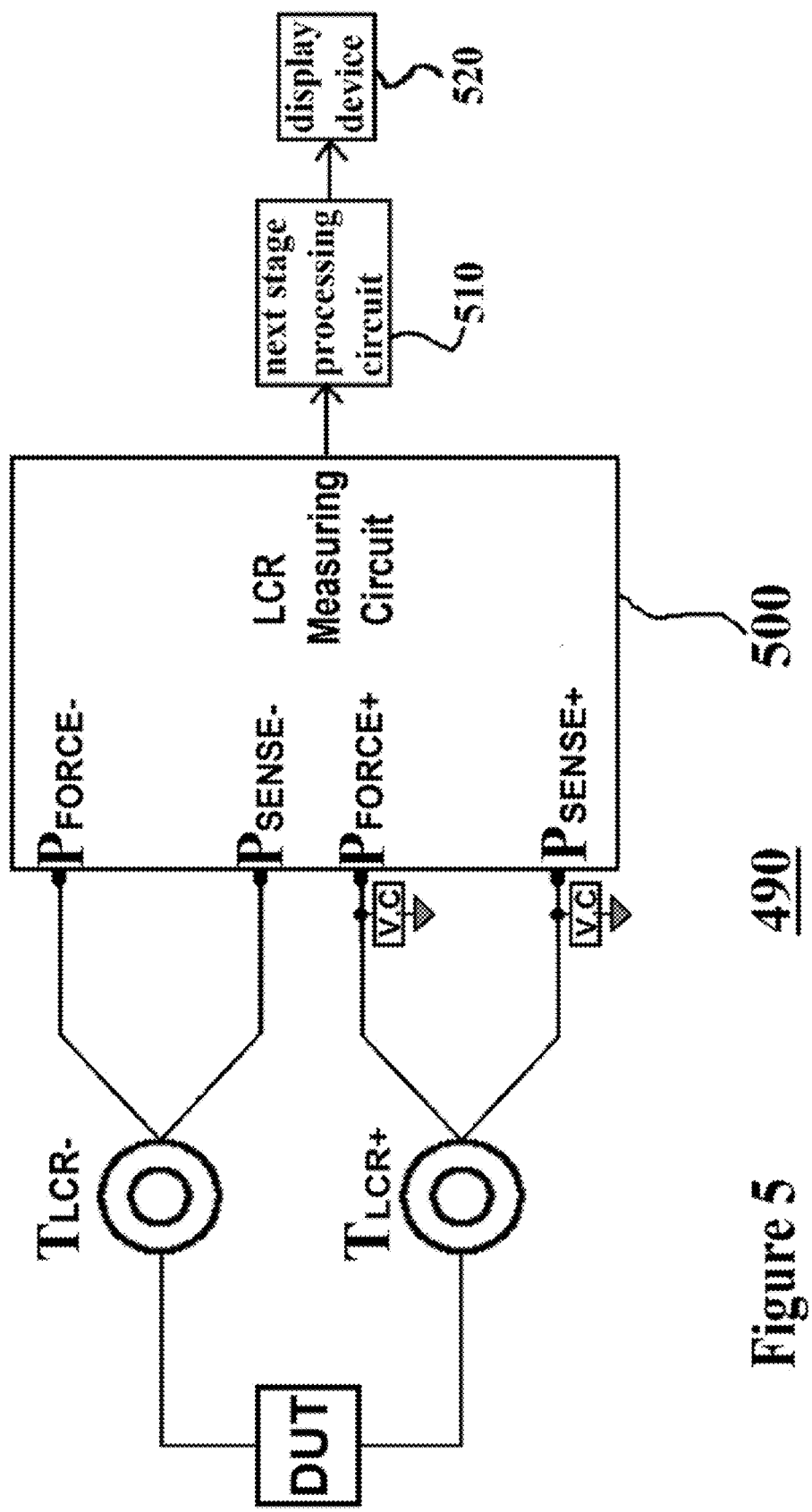
FIG. 5 illustrates the configuration of a conventional LCR meter when the conventional LCR meter is used to measure the parameters of a DUT.

The second, the Terminal $T_{COM(V-/A-/C-/R-)}$ in FIG. 2A is coupled to one end of current shunt resistor $R_{CSR}$ and Pin $P_{SGND}$ and grounded. The other portion of the current shunt resistor $R_{CSR}$ with corresponding fuse and slide switches set (including first current switch $SW_{\mu A}$ and second current switch $SW_{mA}$) enables the measurement mode for current measuring in range of μA and mA respectively. The terminal $T_{LCR-}$ in FIG. 6 is coupled to Pin $P_{FORCE-}$ and Pin $P_{SENSE-}$ respectively through a voltage feeding path and a LCR input path to LCR measuring circuit 900. In comparison, the ground Terminal $T_{COM(V-/A-/C-/R-)}$ in FIG. 8 can be coupled to $P_{FORCE-}$ (through slide switch $SW_{LCRF-}$) and $P_{SENSE-}$ through slide switch $SW_{LCRS-}$) respectively through a second voltage feeding path and a second LCR input path to data acquisition apparatus 1000, and then to the LCR measuring circuit 900. In addition, the ground terminal $T_{COM(V-/A-/C-/R-)}$ can be coupled to the pin $P_{SGND}$ through a slide switch $SW_{DMM}$. In particular, one end of the DMM switch $SW_{DMM}$ is coupled to ground terminal $T_{COM(V-/A-/C-/R-)}$ and to one terminal of the current shunt resistor $R_{CSR1}$, the other end of DMM switch $SW_{DMM}$ is coupled to $P_{SGND}$. When measurement mode DMM is selected, the slide switches $SW_{LCRS-}$ and $SW_{LCRF-}$ are open, the slide switch DMM switch $SW_{DMM}$ is closed, and the $T_{COM(V-/A-/C-/R-)}$ in FIG. 8 serves as terminal $T_{COM(V-/A-/C-/R-)}$ in FIG. 6. In addition, at this moment, the function of and the signal processing within the data acquisition apparatus 1000 according to the present invention is equivalent to that of a conventional DMM.

Figure 9:
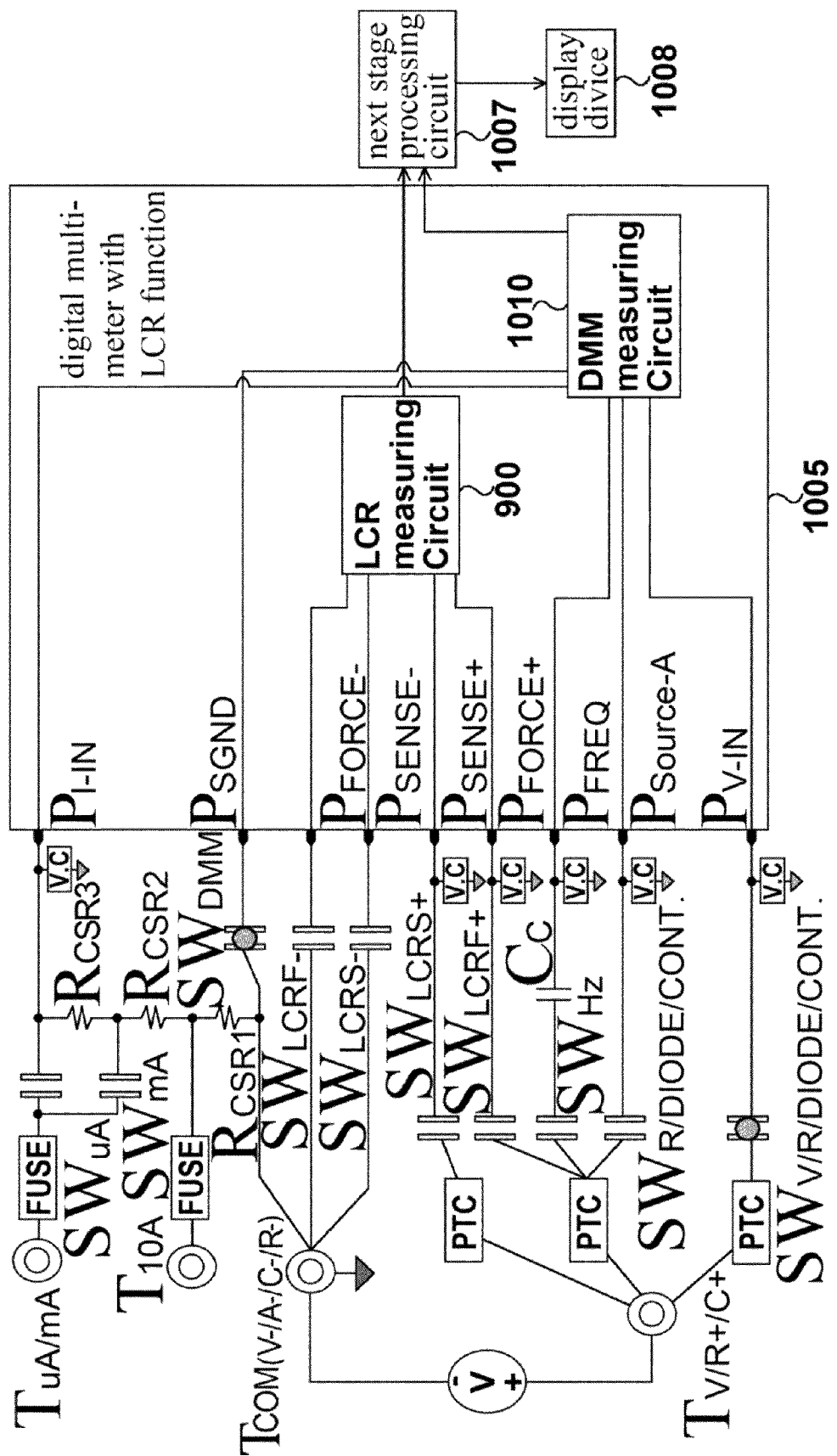
FIG. 9 shows a data acquisition apparatus according to one aspect of one preferred embodiment in the present invention, it illustrates how the input path and corresponding slide switch works when the data acquisition apparatus according to one preferred embodiment of the present invention is used as a DMM to measure voltage between the corresponding input terminals.

To illustrate how the data acquisition apparatus switches between various measurement modes, please refer to FIG. 9. When a voltage source V is connected to the ground terminal $T_{COM(V-/A-/C-/R-)}$ and first terminal $T_{V/R+/C+}$, corresponding slide switches DMM switch $SW_{DMM}$ and voltage input switch $SW_{V/R/DIODE/CONT.}$ are both closed, and corresponding input paths (voltage input path and grounding path) are therefore electrically conductive, thus enabling DMM measuring circuit 1010 to capture the voltage from voltage source V through Pins $P_{V-IN}$ and $P_{SGND}$. Hereafter, in the data acquisition apparatus 1000 according to the present invention, the process of the captured voltage can be proceeded to the next stage toward output as it was processed in a conventional DMM.

Figure 10:
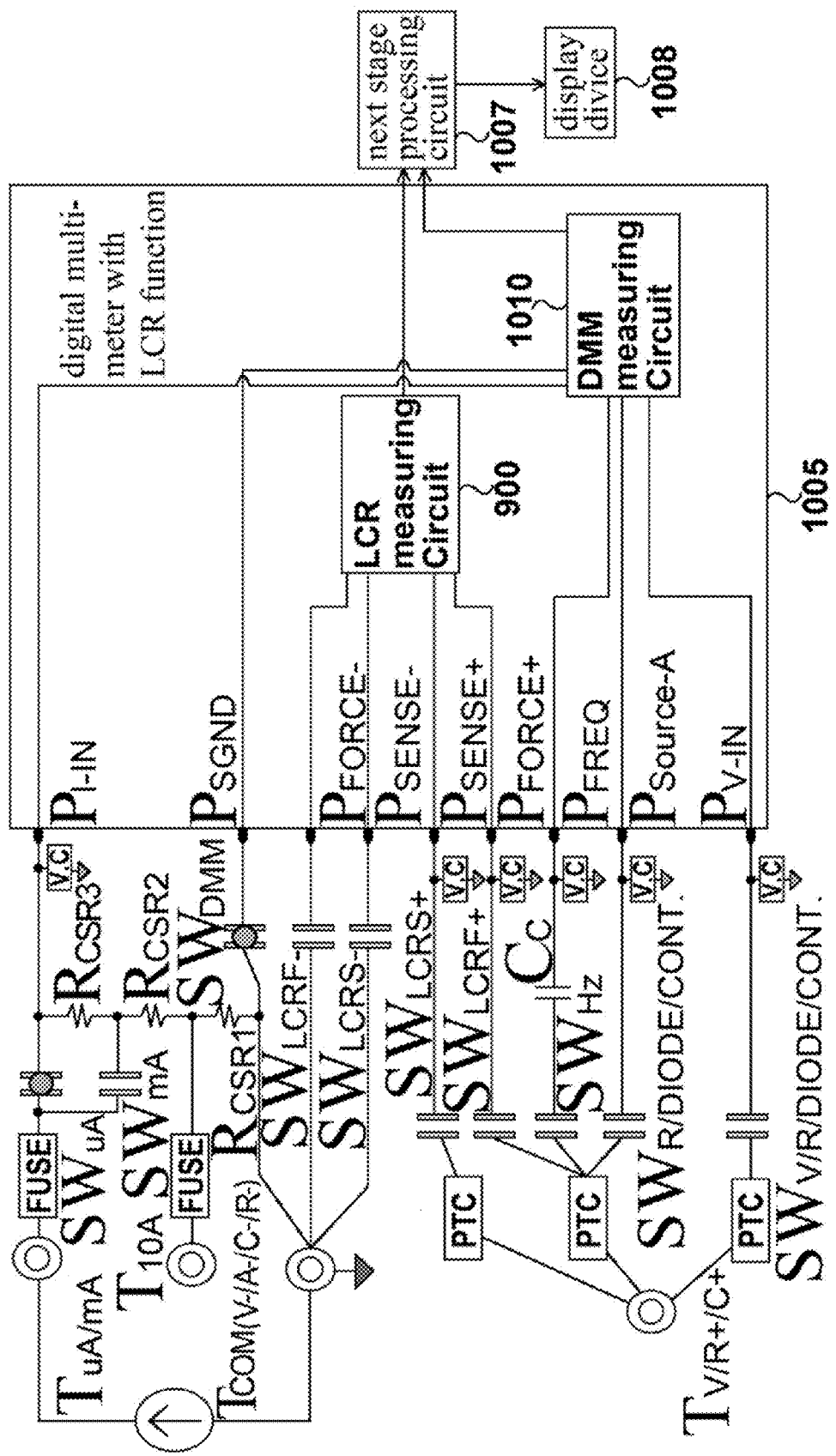
FIG. 10 shows a data acquisition apparatus according to one aspect of one preferred embodiment in the present invention, it illustrates how the input path and corresponding slide switch works when the data acquisition apparatus according to one preferred embodiment of the present invention is used as a DMM to measure the current through the corresponding input terminals.

When the data acquisition apparatus is used to measure the current in a circuit, please refer to FIG. 10, the terminals ground terminal $T_{COM(V-/A-/C-/R-)}$ and the first current terminal $T_{\mu A/mA}$ are connected in series to the circuit of I, and corresponding slide switches DMM switch $SW_{DMM}$ and first current switch $SW_{\mu A}$ are both closed, and corresponding input paths (grounding path and current input path) are therefore electrically conductive, thus enabling DMM measuring circuit 1010 to capture the voltage drop on the current shunt resistor $R_{CSR1}+R_{CSR2}+R_{CSR3}$ through Pins $P_{I-IN}$ and $P_{SGND}$. Hereafter, in the data acquisition apparatus 1000 according to the present invention, the process of the captured voltage can be proceeded to the next stage toward output to show the acquired data. The selection within the switch set (including first current switch $SW_{\mu A}$ and second current switch $SW_{mA}$) can be performed automatically or manually, which mechanism is also widely used in selection of measurement modes in conventional DMM.

Figure 11:
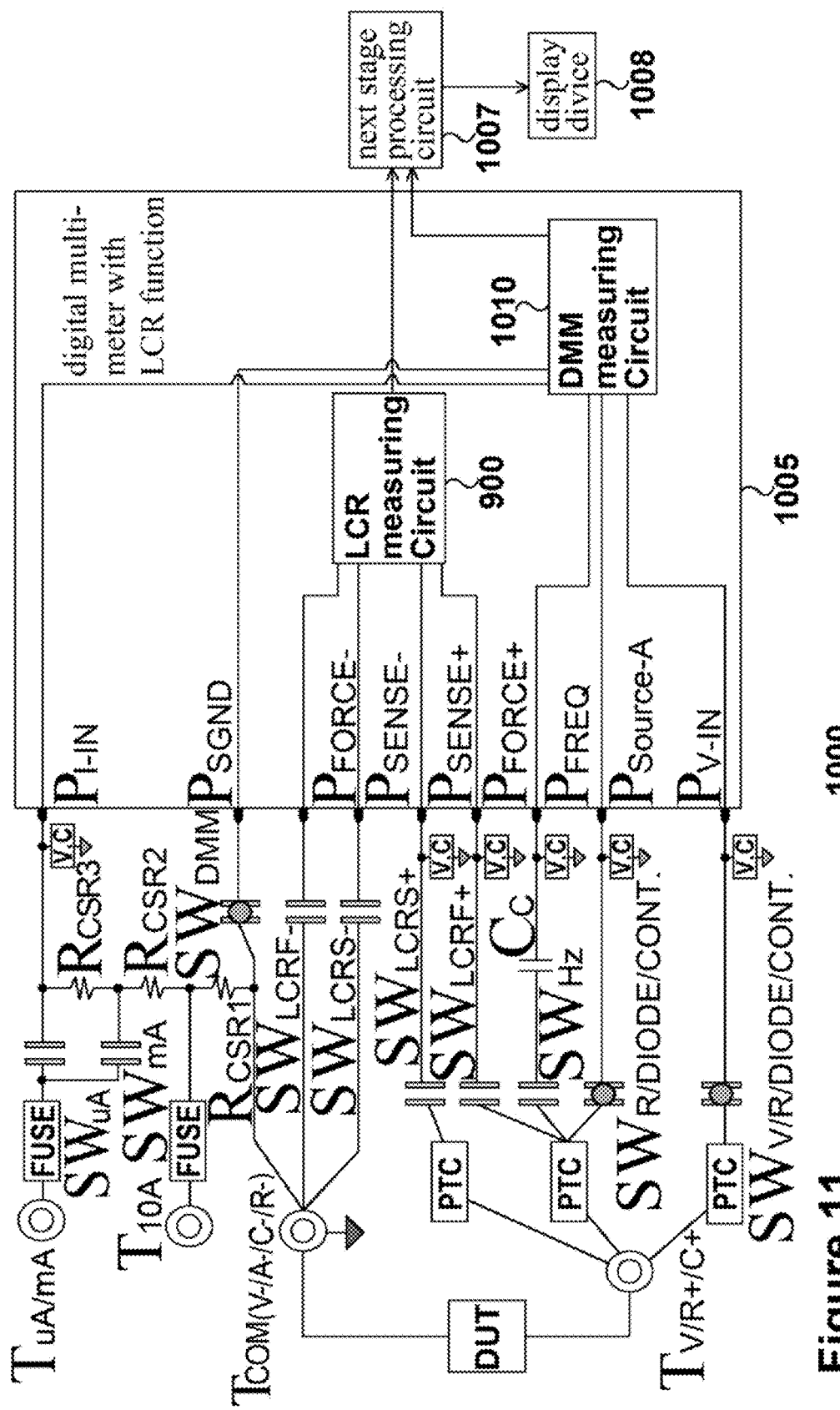
FIG. 11 shows a data acquisition apparatus according to one aspect of one preferred embodiment in the present invention, it illustrates how the input path and corresponding slide switch works when the data acquisition apparatus according to one preferred embodiment of the present invention is used as a DMM to measure dc voltage, diode, resistance, and electrical continuity between the corresponding input terminals.

When the data acquisition apparatus in the present invention is used to measure the parameters of a DUT, such as voltage or current or other data acquired from conventional DMM, please refer to FIG. 11. The terminals ground terminal $T_{COM(V-/A-/C-/R-)}$ and first terminal $T_{V/R+/C+}$ are connected to the DUT, and corresponding slide switches DMM switch $SW_{DMM}$ and dc resistor switch $SW_{R/DIODE/CONT.}$ as well as voltage input switch $SW_{V/R/DIODE/CONT.}$ are all closed, and corresponding input paths (grounding path, voltage input path, and dc resistor input path) are therefore electrically conductive, thus enabling DMM measuring circuit 1010 to capture the voltage drop on the DUT through Pins $P_{SGND}$ and $P_{Source-A}$ as well as $P_{V-IN}$. Hereafter, in the data acquisition apparatus 1000 according to the present invention, the process of the captured voltage can be proceeded to the next stage toward output to show the acquired data. The selection of $SW_{R/DIODE/CONT.}$ and $SW_{V/R/DIODE/CONT.}$ can be performed automatically or manually, which mechanism is also widely used in selection of measurement modes in conventional DMM. In the present disclosure, the DMM switch $SW_{DMM}$, dc resistor switch $SW_{R/DIODE/CONT.}$, voltage input switch $SW_{V/R/DIODE/CONT.}$, frequency input switch $SW_{HZ}$, first current switch $SW_{\mu A}$, and second current switch $SW_{mA}$ can be referred to as DMM function-selection switches.

Figure 1:
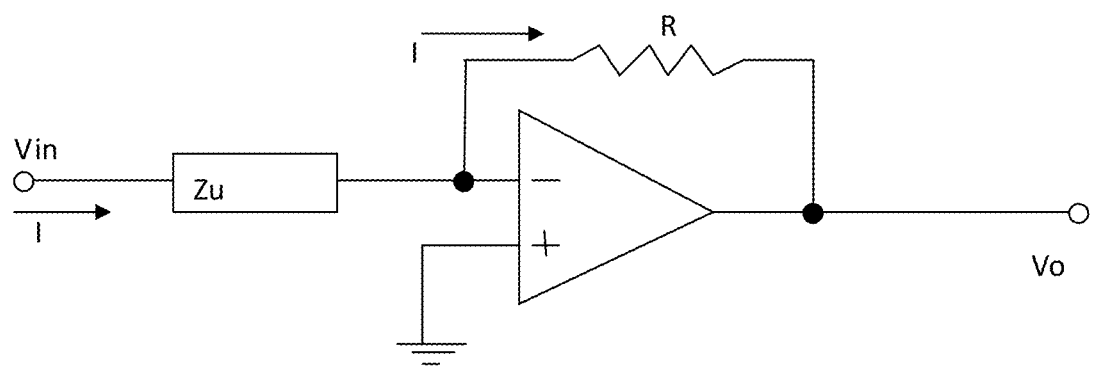
FIG. 1 illustrates how a LCR meter works with the most basic circuit diagram of a balance bridge.

When the data acquisition apparatus in the present invention is used to measure the parameters of a DUT, such as inductance, capacitance or resistance which are usually acquired from a conventional LCR meter. Like a conventional LCR meter, the data acquisition apparatus in the present invention utilize a balance bridge architecture, such as FIG. 1, —applies AC voltage (Vin) or current (I) to the DUT, then acquires the impedance and its angle, thus determines the electrical characteristic of the DUT. When measuring the impedance of a passive component, the data acquisition apparatus in the present invention also applies AC signals to the DUT, in addition, there are also several measurement modes available for selection of different frequencies. In other words, the data acquisition apparatus according to the present invention, like a conventional LCR meter, can apply a signal (voltage or current) to the DUT, and change the frequency of the signal. Usually, the frequency range can cover the following: 100 Hz, 120 Hz, 1 KHz, 10 KHz, 100 KHz to 1 MHz.

Figure 13:
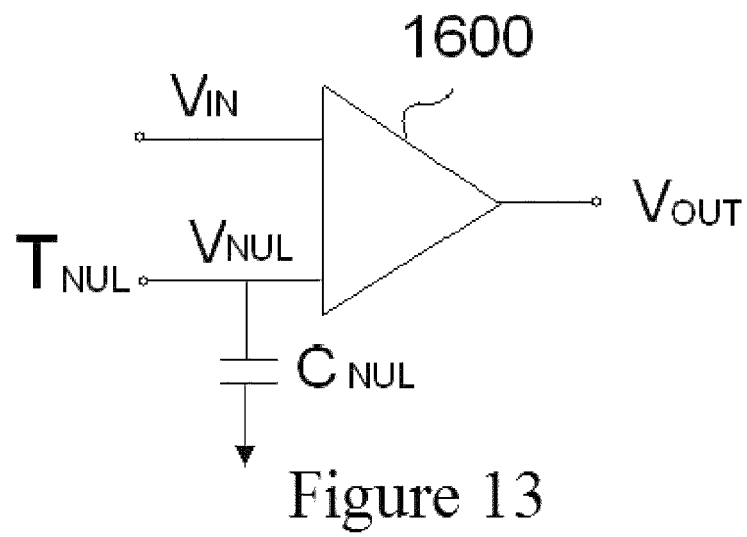
FIG. 13 illustrates the principle as well as the circuit diagram of the auto-zero amplifier according to one preferred embodiment of the present invention.

To better illustrate the present invention, one embodiment of the auto-zero amplifier 930 in FIG. 7 is disclosed herein. The purpose of the auto-zero amplifier 930 is to buffer and to amplify the magnitude of the input signal ($V_{IN}$) with gain K. Please refer to FIG. 13, take the input offset voltage ($V_{OFFSET}$) into consideration, the actual output voltage $V_{OUT}$ becomes: $K(V_{IN}+V_{OFFSET})$. It is the output of a single ended operational amplifier (input buffer) 1600. To implement one embodiment of the auto-zero amplifier used in one embodiment of the present invention, a nulling terminal $T_{NUL}$ coupled to reference-ground with a nulling capacitor $C_{NUL}$ is provided as the other input terminal to the input buffer 1600. The output of the input buffer 1600 becomes: $V_{OUT}=K(V_{IN}+V_{OFFSET}+V_{NUL})$.

Figure 14:
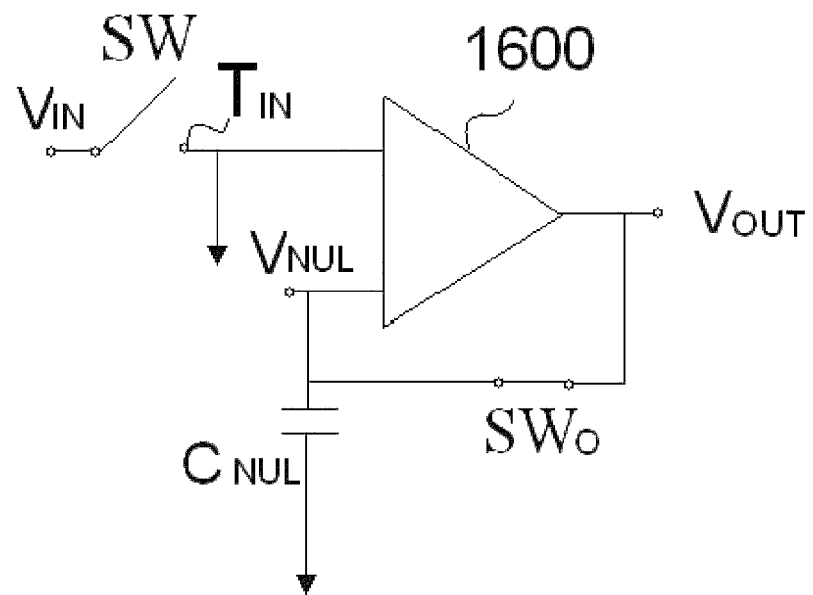
FIG. 14 illustrates the circuit diagram of the auto-zero amplifier according to one preferred embodiment of the present invention, wherein the auto-zero amplifier is in its first (nulling) phase.

When it is used to implement the data acquisition apparatus in one embodiment of the present invention, please refer to FIG. 14. In the first phase, which is a nulling phase, the voltage $V_{IN}$ is not applied to the input terminal $T_{IN}$ because the switch SW is open in the first phase, instead, the input terminal $T_{IN}$ was grounded. The voltage $V_{NUL}$ on one end of the capacitor $C_{NUL}$ appears on the output terminal, because the switch $SW_O$ between the output terminal and the other input terminal coupled to $C_{NUL}$ is closed in the first phase, therefore the output voltage ($V_{OUT}$) of the input buffer 1600 in the first phase will be $V_{OUT}=K(0+V_{OFFSET}+V_{NUL})$. In addition, as shown in FIG. 14, one end of $C_{NUL}$ is directly coupled to output terminal, so $V_{OUT}=V_{NUL}$, thus $V_{OUT}=K(V_{OFFSET}+V_{OUT})$. Therefore, in the first phase, the voltage on one end of the capacitor $C_{NUL}$ is expressed as $V_{NUL}=V_{OUT}=(K/(1-K))V_{OFFSET}\approx V_{OFFSET}|_{K>>1}$. It is proved that with the gain K far greater than 1, then, in the first phase, the magnitude of the offset voltage $|V_{OFFSET}|$ in the input buffer can be actually treated as the magnitude of the voltage on one end of the capacitor $|V_{NUL}|$. The difference can be neglected due to the magnitude of gain K predetermined by the designer of the data acquisition apparatus according to the present invention.

Figure 15:
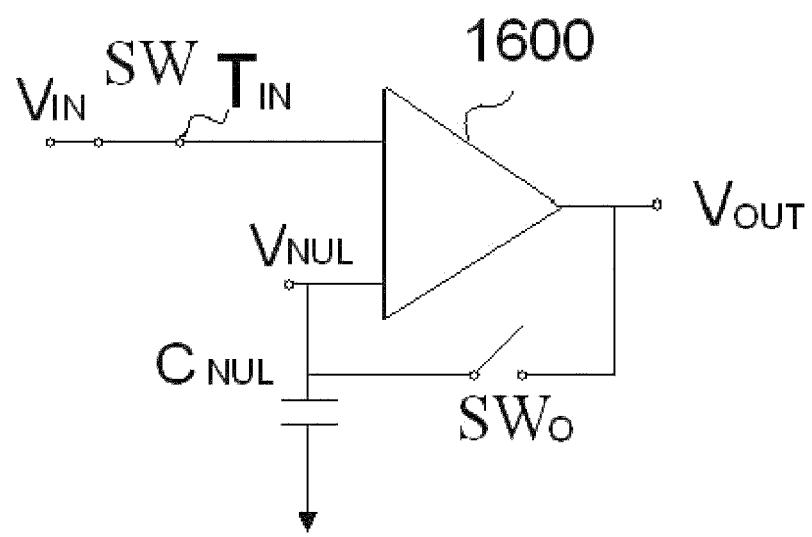
FIG. 15 illustrates the circuit diagram of the auto-zero amplifier according to one preferred embodiment of the present invention, wherein the auto-zero amplifier is in its second (magnification) phase.

In the second phase, which is the amplification phase when operating the input buffer in one embodiment of the present invention, please refer to FIG. 15, the switch on the input terminal $T_{IN}$ is closed, in addition, the switch $SW_O$ between the other input terminal and the output terminal is kept open. In this phase, the input voltage $V_{IN}$ is equal to the voltage from exterior, in one embodiment of the present invention, from the input path of the LCR measuring circuit 900 (in FIG. 7). Therefore, please refer back to FIG. 15, in this magnification phase, it is concluded that $V_{OUT}=K(V_{IN}+V_{OFFSET}+V_{NUL})=K(V_{IN}+V_{OFFSET}+(-V_{OFFSET}))=KV_{IN}$. As a result, the output voltage of the input buffer 1600 (in FIG. 15) is the input voltage $V_{IN}$ multiplied by gain K. Consequently, the output voltage of the auto-zero amplifier 930 (FIG. 7) has eliminated the effect of the offset voltage from the operational amplifier itself, and simultaneously amplified the input voltage by K times, which is predetermined by the designer of the data acquisition apparatus according to the present invention.

Figure 12:
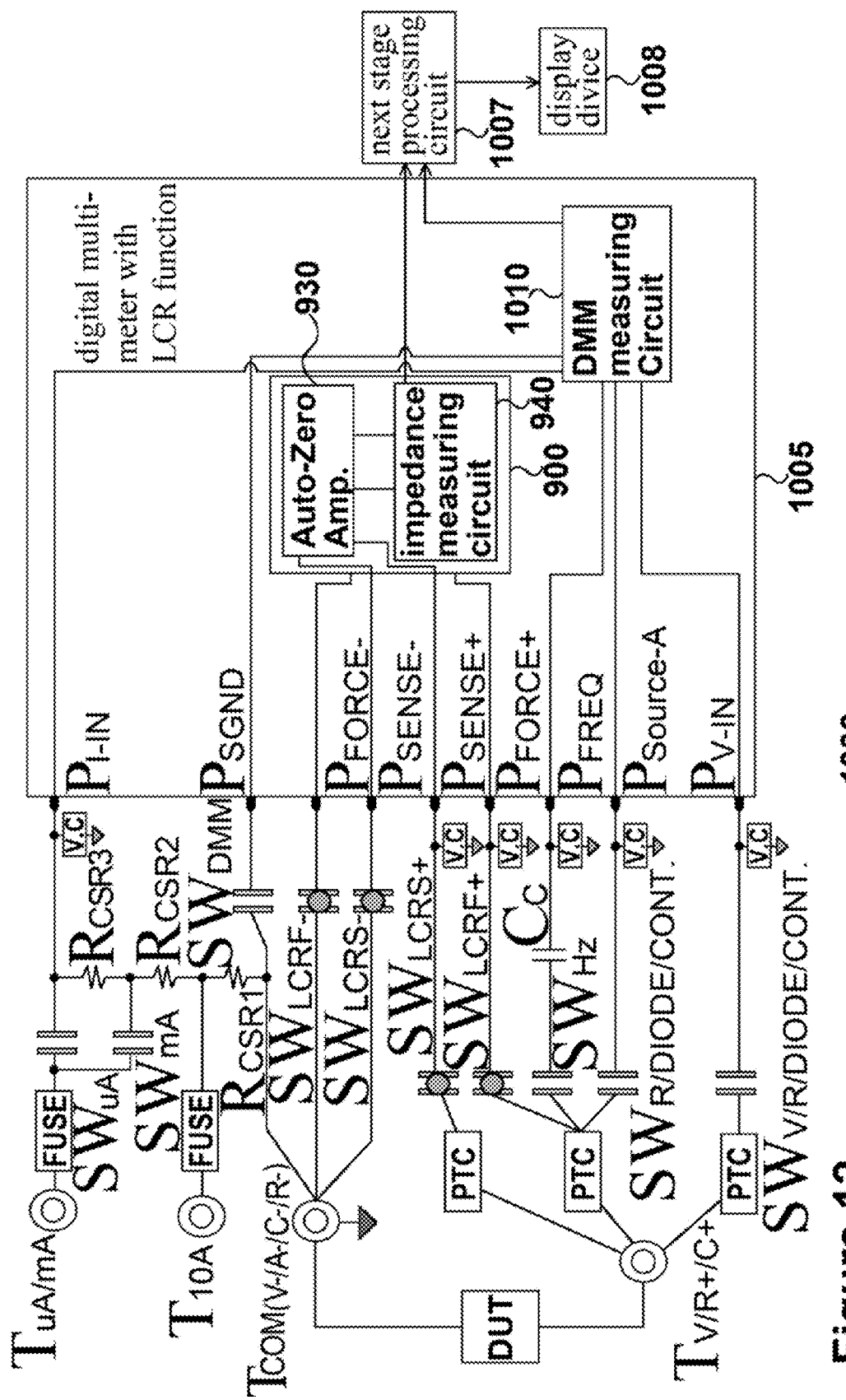
FIG. 12 shows a data acquisition apparatus according to one aspect of one preferred embodiment in the present invention, it illustrates how the input paths as well as voltage feeding paths and their corresponding slide switches work when the data acquisition apparatus according to one preferred embodiment of the present invention is used as a LCR meter to measure the impedance between the corresponding input terminals utilizing ac signal.

In conclusion, the operational amplifier (i.e., input buffer 1600 shown in FIG. 15) used in the auto-zero amplifier 930 (FIG. 12) can adequately amplify the signal from Device Under Test, thus the accuracy of the measurement by impedance measuring circuit 940 and the resulted LCR measuring circuit 900 is resulted in spite of the large resistance PTC 910 and 920 in its input paths. Furthermore, to better describe corresponding operation of the input buffer 1600 (FIG. 15) and the data acquisition apparatus 1000 (FIG. 12) according to one embodiment of the present invention, the status of the switch SW in FIG. 15 is opposite to the status of the switch SWo.

Figure 16:
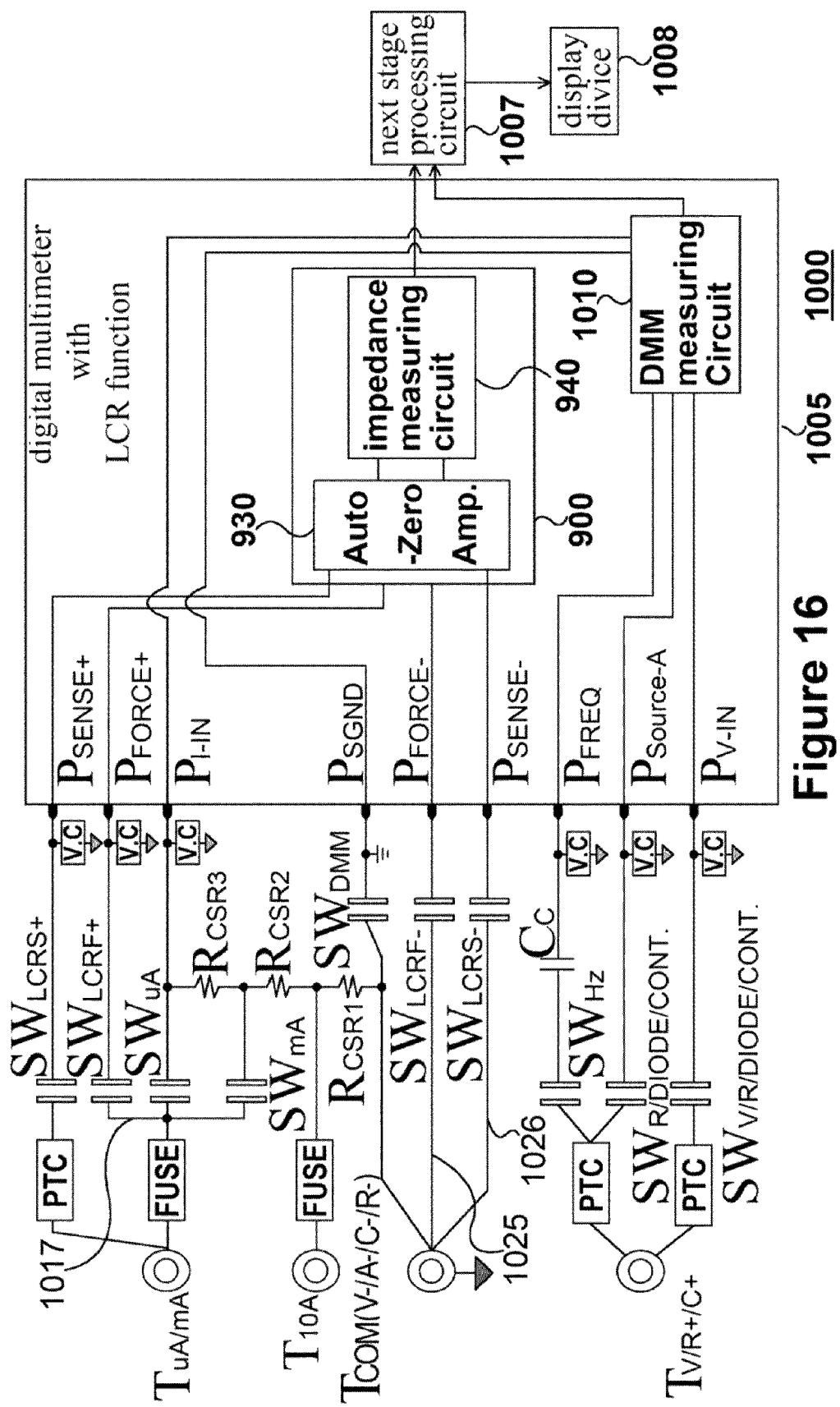
FIG. 16 illustrates a data acquisition apparatus according to the other aspect of one preferred embodiment in the present invention, it illustrates how the input paths as well as voltage feeding paths and corresponding slide switch were rearranged.

Upon disclosure of the circuitry of the data acquisition apparatus according to one embodiment of the present invention, those who skilled in the art can easily modify a portion of the circuit to make the appearance of the layout different from that disclosed in the present invention. For example, the modification could rearrange the connection of input path as well as the voltage feeding path related to LCR measuring function, e.g., in FIG. 8, disconnect form $T_{V/R+/C+}$, instead, connect to the first current terminal $T_{\mu A/mA}$. The resulted circuit diagram is shown in FIG. 16, it does not change the materiality of the present invention, instead, it's a rearrangement of the input paths and voltage feeding paths. In this disclosure, all PTC resistors are referring to protecting devices for the requirement of safety standard, which can be replaced with other devices having equivalent resistance of 1000Ω to 2000Ω. Some other modifications, such as implement DMM measuring circuit and LCR measuring circuit built on separate integrated circuit or on separate substrates of integrated circuit, as long as the data acquisition apparatus, i.e., the DMM with LCR function, in the first phase, can be used (as a DMM) to measure voltage, current, frequency, diode, resistance, or capacitance . . . etc, in the second phase, it can be used (as a LCR meter) to measure the parameters such as impedance, quality factor (Q), or Dissipation factor (D) . . . etc, all these kind of modification should be within the scope of the present invention. Furthermore, in the other embodiment of the present invention, the first phase and the second phase are not necessary anymore, instead, an inverting low pass filter is utilized in the circuit diagram of FIG. 13 to replace switches SW and $SW_O$ (FIG. 15) and to provide the function of auto-zero amplifier with even better performance than that in a couple paragraphs previously described.

Figure 17:
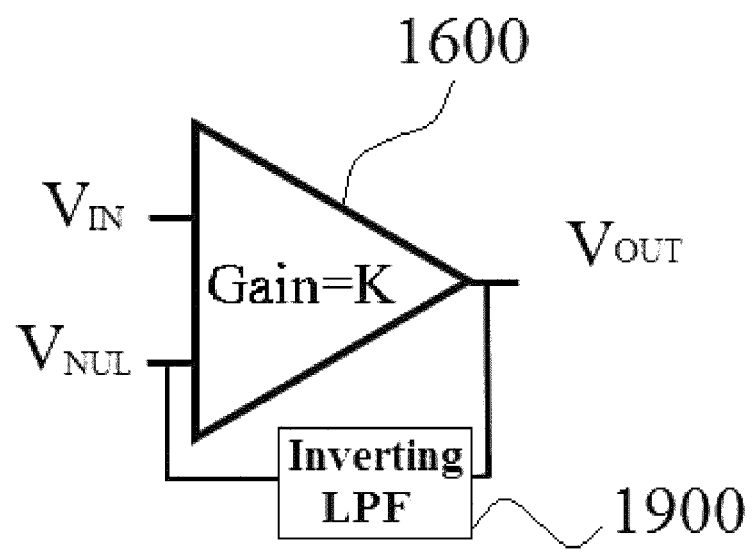
FIG. 17 illustrates the circuit diagram of the auto-zero amplifier according to the other embodiment of the present invention, wherein all the input and output terminals in this embodiment are the same with the previous embodiment, in addition, this embodiment utilizes inverting low pass amplifier instead of switches and the control of phase change in the auto-zero amplifier is not necessary in this embodiment.

In the other embodiment of the present invention, there is one other way to implement the auto-zero amplifier, please refer to FIG. 17, it does not need to change phase, but an inverting low pass filter 1900 must be utilized to work with the input buffer 1600. Thus the other embodiment of the present invention can eliminate the offset voltage from the input buffer, in addition, the dc component of the input signal ($V_{IN}$) is therefore blocked from the output terminal ($V_{OUT}$).

For direct current, $V_{NUL} = -DC\{V_{OUT}\}$, and the input voltage $V_{IN}$ includes DC component as well as AC component, so $V_{IN} = V_{IN,DC} + V_{IN,AC}$, and $V_{NUL} = -DC\{V_{OUT}\} = -K(V_{IN,DC} + V_{Offset} + V_{NUL}) = (-K)[1/(1+K)](V_{IN,DC} + V_{Offset}) = -(V_{IN,DC} + V_{Offset})|_{K>>1}$. So $V_{OUT} = K(V_{IN,DC} + V_{IN,AC} + V_{Offset} + V_{NUL}) \approx K V_{IN,AC}$. From the aforementioned equations, it is proved that the dc component of the input signal has been blocked from the output terminal, and the offset voltage from the input buffer has been eliminated, furthermore, the output voltage is K times the ac component of the input signal. Again, it is proved that the auto-zero amplifier according to the other embodiment of the present invention can eliminate the offset voltage as well as block the dc component of the input signal ($V_{IN}$), and adequately amplify the signal from Device Under Test, thus the accuracy of the acquired data (measured parameters) from the impedance measuring circuit 940 included in the LCR measuring circuit 900 is greatly improved in spite of the large resistance PTC 910 and 920 in its input paths.

From the description of a couple paragraphs above, please refer to FIG. 17, according to the other embodiment of the present disclosure, the data acquisition apparatus at least includes a inverting low pass filter 1900, nulling capacitor $C_{NUL}$ (shown in FIG. 15 instead of FIG. 17, in addition, the way of connection of $C_{NUL}$ in these two Figures are materially the same), and an input buffer 1600 with gain K. Wherein, the input buffer at least includes a first input terminal, a second input terminal, and an output terminal. The input voltage on the first input path includes a direct current DC component and AC component, and the output terminal is being electrically coupled to one terminal of the nulling capacitor $C_{NUL}$ and a second terminal of the input buffer 1600, in addition, the other terminal of $C_{NUL}$ is being reference-grounded. Furthermore, the bandwidth of the inverting low pass filter 1900 is being selected in connection with the predetermined gain K to make the voltage on one terminal of the nulling capacitor reach the order of DC component of the input voltage plus offset voltage of the input buffer, which is an operational amplifier. simultaneously, the voltage on the output terminal of the operational amplifier is in the order of AC component of the input voltage multiplied by the predetermined gain K. (此段改自 claim 17)

It will be understood that the above description of embodiments is given by way of example only and that various modifications may be made by those with ordinary skill in the art. The above specification, examples and data provide a complete description of the structure and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of this invention.

What is claimed is:

1. Data acquisition apparatus enclosed in a housing for measuring parameters from a device under test, output of the data acquisition apparatus being fed to a next stage process circuit of said data acquisition apparatus, then subsequently fed to a display device of the handheld housing to show the parameters, said data acquisition apparatus comprising:
   a digital multi-meter comprising a multi-meter measuring circuit, said multi-meter measuring circuit being electrically coupled to a first terminal and a second terminal, said housing respectively providing a hole for said first terminal and said second terminal, thus enabling objects outside exterior surface of said housing electrically coupled to said first terminal and said second terminal, said first terminal being coupled to a dc resistor input path having a dc resistor input switch and a first protection device, output of said digital multi-meter being first kind of output signal of the data acquisition apparatus; and
   a LCR measuring circuit comprising an impedance measuring circuit and an auto-zero amplifier selectively coupled respectively to said first terminal with one LCR input path and to said second terminal through the other LCR input path, said LCR measuring circuit being selectively coupled respectively to said first terminal with one voltage feeding path and to said second terminal with the other voltage feeding path, each of the two LCR input paths and the two voltage feeding paths having a LCR switch, status change of all LCR switches being synchronized, one of said two voltage feeding paths electrically couples said LCR measuring circuit to said first terminal through said first protection device, when all LCR switches closed, a voltage drop on said device under test being amplified by said auto-zero amplifier, then fed to said impedance measuring circuit to determine the impedance of said device under test, thereby acquired a second kind if output, user's operation makes one of said first kind of output and said second kind of output selected as said output of said data acquisition apparatus.

2. Data acquisition apparatus as claim 1 further comprises a first current terminal and a second current terminal, said housing respectively provides a hole for said first current terminal and said second current terminal, thus enabling objects outside exterior surface of said housing electrically coupled to said first current terminal and said second current terminal, wherein said digital multi-meter further comprises a next stage circuit and a digital multi-meter (DMM) measuring circuit selectively coupled respectively to said first current terminal through a current input path having a first current switch and a second current switch, and to said second terminal through a grounding path having a DMM switch, said first terminal being electrically coupled to said DMM measuring circuit through said dc resistor input path.

3. Data acquisition apparatus as claim 2, wherein said DMM measuring circuit is electrically coupled to said first terminal through a voltage input path having a voltage input switch, and is coupled to said first terminal through said dc resistor input path, one end of said voltage input switch being coupled to one end of a first voltage clamping circuit and to said DMM measuring circuit, the other end of said voltage input switch being coupled to said first terminal through a second protection device, said DMM switch being coupled to said second terminal.

4. Data acquisition apparatus as claim 3 being used to measure voltage drop between said first terminal and said second terminal when said DMM switch and said voltage input switch are both closed.

5. Data acquisition apparatus as claim 3, wherein said dc resistor input path electrically couples said DMM measuring circuit to a dc resistor input switch, one end of said dc resistor input switch coupling to said first terminal through a third protection device, the other end of said dc resistor input switch being electrically coupled to one end of a second voltage clamping circuit and to said DMM measuring circuit, said DMM switch being electrically coupled to said second terminal, the other end of said voltage input switch being coupled to said first terminal through a second protection device.

6. Data acquisition apparatus as claim 5 being used to measure direct current (DC) resistance between said first terminal and said second terminal when all of the following switches are closed: a corresponding DMM function-selection switch electrically coupled to said third protection device, the other corresponding DMM function-selection switch electrically coupled to said second protection device, and said DMM switch.

7. Data acquisition apparatus as claim 2, wherein voltage drop between said first terminal and said second terminal is used to determine impedance when status of said DMM switch being opened.

8. Data acquisition apparatus as claim 2, wherein said DMM switch has one end both electrically coupled to said second terminal and to one end of a current shunt resistor, the other end of said current shunt resistor being coupled to said second current terminal through a first fuse, and the other end of said current shunt resistor being also coupled to said first current terminal through the other current shunt resistor connected with a switch set and a second fuse, said switch set comprising said first current switch, said second switch, and a third current shunt resistor connecting one end of said first current switch and one end of said second current switch.

9. Data acquisition apparatus as claim 8, wherein voltage drop on said current shunt resistor plus said other current shunt resistor and said third current shunt resistor is used to determine the current through said second terminal when said DMM switch being closed and at least one of said first current switch as well as said second current switch being opened.

10. Data acquisition apparatus as claim 8, wherein said one end of said first current switch is coupled to a third voltage clamping circuit, said one end of said second current switch is coupled to the other end of said other current shunt resistor, the other end of said first current switch as well as the other end of said second current switch are electrically coupled to said first current terminal through said second fuse.

11. Data acquisition apparatus as claim 1, wherein said digital multi-meter further comprises a digital multi-meter (DMM) measuring circuit selectively coupled to a first current terminal through a frequency input path having a frequency input switch, one end of said frequency input switch being electrically coupled to said first terminal through a third protection device, the other end of said frequency input switch being electrically coupled to said DMM measuring circuit and a fourth voltage clamping circuit through a coupling capacitor, said DMM switch being coupled to said second terminal.

12. Data acquisition apparatus as claim 11 being used to measure frequency of a signal through said first terminal and said second terminal when said frequency switch and said ground switch are both closed.

13. Data acquisition apparatus as claim 1, wherein said first protection device is a resistor with Positive Temperature Coefficient.

14. Data acquisition apparatus as claim 1, wherein said LCR measuring circuit is implemented in integrated circuit, said housing being a handheld housing.

15. Data acquisition apparatus as claim 1, wherein said digital multi-meter further comprises a digital multi-meter measuring circuit implemented in integrated circuit, said digital multi-meter measuring circuit and said LCR measuring circuit being fabricated in a single chip of integrated circuit.

16. Data acquisition apparatus as claim 1, wherein said auto-zero amplifier comprises an input switch, an output switch, a nulling capacitor, and an operational amplifier having a predetermined gain, said operational amplifier comprising a first input terminal, a second input terminal, and an output terminal, in a nulling phase, said input switch being opened to enable said first input terminal of said operational amplifier to electrically coupled to reference-ground, simultaneously, said output switch being closed to enable said output terminal of said operational amplifier to electrically coupled to said second input terminal of said operational and to one terminal of said nulling capacitor, in an amplification phase, said input switch being closed to enable said first input terminal of said operational amplifier to electrically coupled to one of said two LCR input paths to acquire input voltage for said operational amplifier, simultaneously, said output switch being opened to disconnect said output terminal of said operational amplifier with said second input terminal of said operational, simultaneously, voltage on said output terminal of said operational amplifier being in the order of said input voltage multiplied by said predetermined gain.

17. Data acquisition apparatus as claim 1, wherein said auto-zero amplifier comprises an inverting low pass filter, a nulling capacitor, and an operational amplifier having a predetermined gain, said operational amplifier comprising a first input terminal, a second input terminal, and an out terminal, input voltage on said first input terminal of said operational amplifier being consisting of dc component and ac component, said output terminal being coupled to one terminal of said nulling capacitor and to said second terminal of said operational amplifier, the other terminal of said nulling capacitor being electrically coupled to reference-ground, bandwidth of said inverting low pass filter being selected in connection with said predetermined gain to make voltage on said one terminal of said nulling capacitor reach the order of dc component of said input voltage plus offset voltage of said operational amplifier, simultaneously, voltage on said output terminal of said operational amplifier being in the order of ac component of said input voltage multiplied by said predetermined gain.

18. A front end chip used in a data acquisition apparatus for measuring parameters from a device under test, output of said front end chip being fed to next stage process circuit, and then to display device of said data acquisition apparatus to show the measured parameters, said data acquisition apparatus being adopted in a housing, said front end chip comprising:
 a multi-meter measuring circuit electrically coupled to a first terminal and a second terminal, said housing respectively providing a hole for said first terminal and said second terminal, thus enabling objects outside exterior surface of said housing electrically coupled to said first terminal and said second terminal, said first terminal being coupled to a dc resistor input path having a dc resistor input switch and a first protection device, output of said digital multi-meter being first kind of output signal of the data acquisition apparatus; and a LCR measuring circuit comprising an impedance measuring circuit and an auto-zero amplifier selectively coupled respectively to said first terminal with one LCR input path and to said second terminal through the other LCR input path, said LCR measuring circuit being selectively coupled respectively to said first terminal with one voltage feeding path and to said second terminal with the other voltage feeding path, each of the two LCR input paths and the two voltage feeding paths having a LCR switch, status change of all LCR switches being synchronized, one of said two voltage feeding paths electrically couples said LCR measuring circuit to said first terminal through said first protection device, when all LCR switches closed, a voltage drop on said device under test being amplified by said auto-zero amplifier, then fed to said impedance measuring circuit to determine the impedance of said device under test, thereby acquired a second kind if output, user's operation makes one of said first kind of output and said second kind of output selected as said output of said data acquisition apparatus.

19. The front end chip as claim 18, wherein said data acquisition apparatus further comprises: a first current terminal and a second current terminal, said housing respectively provides a hole for said first current terminal and said second current terminal, thus enabling objects outside exterior surface of said housing electrically coupled to said first current terminal and said second current terminal, wherein said digital multi-meter further comprises a next stage circuit and a digital multi-meter (DMM) measuring circuit selectively coupled respectively to said first current terminal through a current input path having a first current switch and a second current switch, and to said second terminal through a grounding path having a DMM switch, said first terminal being electrically coupled to said DMM measuring circuit through said dc resistor input path, output terminal of said LCR measuring circuit being electrically coupled to input terminal of said next stage process circuit, output terminal of said multi-meter measuring circuit being electrically coupled to input terminal of said next stage process circuit, said next stage process circuit being used to selectively process output of said multi-meter measuring circuit and said LCR measuring circuit.

20. The front end chip as claim 19, wherein said DMM measuring circuit is electrically coupled to said first terminal through a voltage input path having a voltage input switch, and is coupled to said first terminal through said dc resistor input path, one end of said voltage input switch being coupled to one end of a first voltage clamping circuit and to said DMM measuring circuit, the other end of said voltage input switch being coupled to said first terminal through a second protection device, said DMM switch being coupled to said second terminal.

21. The front end chip as claim 20, wherein said Data acquisition apparatus being used to measure voltage drop between said first terminal and said second terminal when said DMM switch and said voltage input switch are both closed.

22. The front end chip as claim 20, wherein said dc resistor input path electrically couples said DMM measuring circuit to a dc resistor input switch, one end of said dc resistor input switch coupling to said first terminal through a third protection device, the other end of said dc resistor input switch being electrically coupled to one end of a second voltage clamping circuit and to said DMM measuring circuit, said DMM switch being electrically coupled to said second terminal, the other end of said voltage input switch being coupled to said first terminal through a second protection device.

23. The front end chip as claim 22, wherein said Data acquisition apparatus is used to measure direct current (DC) resistance between said first terminal and said second terminal when all of the following switches are closed: a corresponding DMM function-selection switch electrically coupled to said third protection device, the other corresponding DMM function-selection switch electrically coupled to said second protection device, and said DMM switch.

24. The front end chip as claim 19, wherein voltage drop between said first terminal and said second terminal is used to determine impedance when status of said DMM switch being opened.

25. The front end chip as claim 19, wherein said DMM switch has one end both electrically coupled to said second terminal and to one end of a current shunt resistor, the other end of said current shunt resistor being coupled to said second current terminal through a first fuse, and the other end of said current shunt resistor being also coupled to said first current terminal through the other current shunt resistor connected with a switch set and a second fuse, said switch set comprising said first current switch, said second switch, and a third current shunt resistor connecting one end of said first current switch and one end of said second current switch.

26. The front end chip as claim 25, wherein voltage drop on said current shunt resistor plus said other current shunt resistor and said third current shunt resistor is used to determine the current through said second terminal when said DMM switch being closed and at least one of said first current switch as well as said second current switch being opened.

27. The front end chip as claim 25, wherein said one end of said first current switch is coupled to a third voltage clamping circuit, said one end of said second current switch is coupled to the other end of said other current shunt resistor, the other end of said first current switch as well as the other end of said second current switch are electrically coupled to said first current terminal through said second fuse.

28. The front end chip as claim 18, wherein said digital multi-meter (DMM) measuring circuit selectively coupled to a first current terminal through a frequency input path having a frequency input switch, one end of said frequency input switch being electrically coupled to said first terminal through a third protection device, the other end of said frequency input switch being electrically coupled to said DMM measuring circuit and a fourth voltage clamping circuit through a coupling capacitor, said DMM switch being coupled to said second terminal.

29. The front end chip as claim 28 being used to measure frequency of a signal through said first terminal and said second terminal when said frequency switch and said ground switch are both closed.

30. The front end chip as claim 18, wherein said first protection device is a resistor with Positive Temperature Coefficient.

31. The front end chip as claim 18, wherein said LCR measuring circuit is implemented in integrated circuit, said housing being a handheld housing.

32. The front end chip as claim 18, wherein said digital multi-meter measuring circuit is implemented in integrated circuit, said digital multi-meter measuring circuit and said LCR measuring circuit being fabricated in a single chip of integrated circuit.

33. The front end chip as claim 18, wherein said auto-zero amplifier comprises an input switch, an output switch, a nulling capacitor, and an operational amplifier having a predetermined gain, said operational amplifier comprising a first input terminal, a second input terminal, and an output terminal, in a nulling phase, said input switch being opened to enable said first input terminal of said operational amplifier to electrically coupled to reference-ground, simultaneously, said output switch being closed to enable said output terminal of said operational amplifier to electrically coupled to said second input terminal of said operational and to one terminal of said nulling capacitor, in an amplification phase, said input switch being closed to enable said first input terminal of said operational amplifier to electrically coupled to one of said two LCR input paths to acquire input voltage for said operational amplifier, simultaneously, said output switch being opened to disconnect said output terminal of said operational amplifier with said second input terminal of said operational, simultaneously, voltage on said output terminal of said operational amplifier being in the order of said input voltage multiplied by said predetermined gain.

34. The front end chip as claim 18, wherein said auto-zero amplifier comprises an inverting low pass filter, a nulling capacitor, and an operational amplifier having a predetermined gain, said operational amplifier comprising a first input terminal, a second input terminal, and an out terminal, input voltage on said first input terminal of said operational amplifier being consisting of dc component and ac component, said output terminal being coupled to one terminal of said nulling capacitor and to said second terminal of said operational amplifier, the other terminal of said nulling capacitor being electrically coupled to reference-ground, bandwidth of said inverting low pass filter being selected in connection with said predetermined gain to make voltage on said one terminal of said nulling capacitor reach the order of dc component of said input voltage plus offset voltage of said operational amplifier, simultaneously, voltage on said output terminal of said operational amplifier being in the order of ac component of said input voltage multiplied by said predetermined gain.

35. Data acquisition apparatus enclosed in a housing for measuring parameters from a device under test, output of the data acquisition apparatus being fed to a next stage process circuit of said data acquisition apparatus, then subsequently fed to a display device of the handheld housing to show the parameters, said data acquisition apparatus comprising:
 a digital multi-meter comprising a multi-meter measuring circuit, said multi-meter measuring circuit being electrically coupled to a first terminal, a second terminal, a first current terminal, and a second current terminal, said housing respectively providing a hole for said first terminal, said second terminal, said first current terminal, and said second current terminal, thus enabling objects outside exterior surface of said housing electrically coupled to said first terminal, said second terminal, said first current terminal, and said second current terminal, said first terminal being coupled to a dc resistor input path having a dc resistor input switch and a first protection device, output of said digital multi-meter being first kind of output signal of the data acquisition apparatus; and
 a LCR measuring circuit comprising an impedance measuring circuit and an auto-zero amplifier selectively coupled respectively to said first current terminal with one LCR input path, and to said second terminal through the other LCR input path, said LCR measuring circuit being selectively coupled respectively to said first current terminal with one voltage feeding path, and to said second terminal with the other voltage feeding path, each of the two LCR input paths and the two voltage feeding paths having a LCR switch, status change of all LCR switches being synchronized, one of said two voltage feeding paths electrically couples said LCR measuring circuit to said first terminal through said first protection device, when all LCR switches closed, a voltage drop on said device under test being amplified by said auto-zero amplifier, then fed to said impedance measuring circuit to determine the impedance of said device under test, thereby acquired a second kind if output, user's operation makes one of said first kind of output and said second kind of output selected as said output of said data acquisition apparatus.

36. Data acquisition apparatus as claim 35, wherein said DMM measuring circuit is selectively coupled, respectively, to said first current terminal through a current input path having a first current switch and a second current switch, and to said second terminal through said grounding path having a DMM switch, said first terminal being electrically coupled to said multi-meter measuring circuit through said dc resistor input path.

37. Data acquisition apparatus as claim 36, wherein said DMM measuring circuit is electrically coupled to said first terminal through a voltage input path having a voltage input switch, and is coupled to said first terminal through said dc resistor input path, one end of said voltage input switch being coupled to one end of a first voltage clamping circuit and to said DMM measuring circuit, the other end of said voltage input switch being coupled to said first terminal through a second protection device, said DMM switch being coupled to said second terminal.

38. Data acquisition apparatus as claim 37 being used to measure voltage drop between said first terminal and said second terminal when said DMM switch and said voltage input switch are both closed.

39. Data acquisition apparatus as claim 37, wherein said dc resistor input path electrically couples said DMM measuring circuit to a dc resistor input switch, one end of said dc resistor input switch coupling to said first terminal through a third protection device, the other end of said dc resistor input switch being electrically coupled to one end of a second voltage clamping circuit and to said DMM measuring circuit, said DMM switch being electrically coupled to said second terminal, the other end of said voltage input switch being coupled to said first terminal through a second protection device.

40. Data acquisition apparatus as claim 39 being used to measure direct current (DC) resistance between said first terminal and said second terminal when all of the following switches are closed: a corresponding DMM function-selection switch electrically coupled to said third protection device, the other corresponding DMM function-selection switch electrically coupled to said second protection device, and said DMM switch.

41. Data acquisition apparatus as claim 36, wherein voltage drop between said first terminal and said second terminal is used to determine impedance when status of said DMM switch being opened.

42. Data acquisition apparatus as claim 36, wherein said DMM switch has one end both electrically coupled to said second terminal and to one end of a current shunt resistor, the other end of said current shunt resistor being coupled to said second current terminal through a first fuse, and the other end of said current shunt resistor being also coupled to said first current terminal through the other current shunt resistor connected with a switch set and a second fuse, said switch set comprising said first current switch, said second switch, and a third current shunt resistor connecting one end of said first current switch and one end of said second current switch.

43. Data acquisition apparatus as claim 42, wherein voltage drop on said current shunt resistor plus said other current shunt resistor and said third current shunt resistor is used to determine the current through said second terminal when said DMM switch being closed and at least one of said first current switch as well as said second current switch being opened.

44. Data acquisition apparatus as claim 42, wherein said one end of said first current switch is coupled to a third voltage clamping circuit, said one end of said second current switch is coupled to the other end of said other current shunt resistor, the other end of said first current switch as well as the other end of said second current switch are electrically coupled to said first current terminal through said second fuse.

45. Data acquisition apparatus as claim 35, wherein said digital multi-meter further comprises a digital multi-meter (DMM) measuring circuit selectively coupled to a first current terminal through a frequency input path having a frequency input switch, one end of said frequency input switch being electrically coupled to said first terminal through a third protection device, the other end of said frequency input switch being electrically coupled to said DMM measuring circuit and a fourth voltage clamping circuit through a coupling capacitor, said DMM switch being coupled to said second terminal.

46. Data acquisition apparatus as claim 45 being used to measure frequency of a signal through said first terminal and said second terminal when said frequency switch and said ground switch are both closed.

47. Data acquisition apparatus as claim 35, wherein said first protection device is a resistor with Positive Temperature Coefficient.

48. Data acquisition apparatus as claim 35, wherein said LCR measuring circuit is implemented in integrated circuit, said housing being a handheld housing.

49. Data acquisition apparatus as claim 35, wherein said digital multi-meter further comprises a digital multi-meter measuring circuit implemented in integrated circuit, said digital multi-meter measuring circuit and said LCR measuring circuit being fabricated in a single chip of integrated circuit.

50. Data acquisition apparatus as claim 35, wherein said auto-zero amplifier comprises an input switch, an output switch, a nulling capacitor, and an operational amplifier having a predetermined gain, said operational amplifier comprising a first input terminal, a second input terminal, and an output terminal, in a nulling phase, said input switch being opened to enable said first input terminal of said operational amplifier to electrically coupled to reference-ground, simultaneously, said output switch being closed to enable said output terminal of said operational amplifier to electrically coupled to said second input terminal of said operational and to one terminal of said nulling capacitor, in an amplification phase, said input switch being closed to enable said first input terminal of said operational amplifier to electrically coupled to one of said two LCR input paths to acquire input voltage for said operational amplifier, simultaneously, said output switch being opened to disconnect said output terminal of said operational amplifier with said second input terminal of said operational, simultaneously, voltage on said output terminal of said operational amplifier being in the order of said input voltage multiplied by said predetermined gain.

51. Data acquisition apparatus as claim 35, wherein said auto-zero amplifier comprises an inverting low pass filter, a nulling capacitor, and an operational amplifier having a predetermined gain, said operational amplifier comprising a first input terminal, a second input terminal, and an out terminal, input voltage on said first input terminal of said operational amplifier being consisting of dc component and ac component, said output terminal being coupled to one terminal of said nulling capacitor and to said second terminal of said operational amplifier, the other terminal of said nulling capacitor being electrically coupled to reference-ground, bandwidth of said inverting low pass filter being selected in connection with said predetermined gain to make voltage on said one terminal of said nulling capacitor reach the order of dc component of said input voltage plus offset voltage of said operational amplifier, simultaneously, voltage on said output terminal of said operational amplifier being in the order of ac component of said input voltage multiplied by said predetermined gain.

* * * * *